US010467714B2

(12) United States Patent
Stevenson et al.

(10) Patent No.: US 10,467,714 B2
(45) Date of Patent: Nov. 5, 2019

(54) INTERACTIVE BUILDING STACKING PLAN USER INTERFACE

(71) Applicant: Stevenson Systems, Inc., Laguna Niguel, CA (US)

(72) Inventors: Peter L. Stevenson, Laguna Niguel, CA (US); Nathaniel S. Olson, Laguna Niguel, CA (US); Jim Nista, Long Beach, CA (US)

(73) Assignee: Stevenson Systems, Inc., Laguna Niguel, CA (US)

( * ) Notice: Subject to any disclaimer, the term of this patent is extended or adjusted under 35 U.S.C. 154(b) by 852 days.

(21) Appl. No.: 14/121,833

(22) Filed: Oct. 22, 2014

(65) Prior Publication Data

US 2015/0228038 A1 Aug. 13, 2015

Related U.S. Application Data

(63) Continuation-in-part of application No. 13/842,190, filed on Mar. 15, 2013, now Pat. No. 9,483,754.

(51) Int. Cl.
G01N 29/44 (2006.01)
G06Q 50/16 (2012.01)
(Continued)

(52) U.S. Cl.
CPC ....... G06Q 50/163 (2013.01); G06F 17/5004 (2013.01); G06Q 30/0645 (2013.01)

(58) Field of Classification Search
CPC .............. G06Q 50/163; G06F 17/5004; G06F 30/0645
(Continued)

(56) References Cited

U.S. PATENT DOCUMENTS 5,577,189 A 11/1996 Gay et al.
7,072,665 B1 * 7/2006 Blumberg ............. H04W 4/029
455/456.1
(Continued)

FOREIGN PATENT DOCUMENTS

EP 1947605 A2 7/2008

OTHER PUBLICATIONS

Carlyle_2012 (http://web.archive.org/web/20120715000000*/http://www.carlylecondo.com/stacking.html).*
(Continued)

Primary Examiner — Brian S Cook
(74) Attorney, Agent, or Firm — Stetina Brunda Garred & Brucker

(57) ABSTRACT

A method for presenting an interactive stacking plan of a building with one or more floors of leasable space is disclosed. A request for stacking plan graphical elements is transmitted from the client computer system to the server computer system. Each of the stacking plan graphical elements correspond to a leased or purchased space represented by a master tenant or occupant record defined by a plurality of tenant or occupant record attributes. The stacking plan graphical elements are received, and an output thereof is generated for each of the master tenant or occupant records with a size proportional to a leased or owned space specified in the leased or purchased space identifier attribute and a user-activatable link that generates an independent display of at least one of the master tenant or occupant record attributes. The stacking plan graphical elements may be interacted with in various ways.

10 Claims, 24 Drawing Sheets

(51) Int. Cl.
*G06Q 30/06* (2012.01)
*G06F 17/50* (2006.01)

(58) Field of Classification Search
USPC .......................................................... 703/1
See application file for complete search history.

(56) References Cited

U.S. PATENT DOCUMENTS

| | | | |
|---|---|---|---|
| 7,143,048 | B1 | 11/2006 | Ruben et al. |
| 7,308,411 | B2 | 12/2007 | Silverman et al. |
| 8,195,529 | B1 | 6/2012 | Cohen et al. |
| 8,566,335 | B1 * | 10/2013 | Wickland ............... G06Q 10/06 707/758 |
| 2004/0046798 | A1 | 3/2004 | Alen |
| 2004/0113937 | A1 | 6/2004 | Sawdey et al. |
| 2005/0222861 | A1 * | 10/2005 | Silverman ............ G06Q 10/10 705/307 |
| 2006/0210192 | A1 | 9/2006 | Orhun |
| 2007/0189708 | A1 * | 8/2007 | Lerman ................ G11B 27/034 386/280 |
| 2009/0282349 | A1 * | 11/2009 | Olsen .................. G06F 9/44505 715/760 |
| 2010/0287033 | A1 | 11/2010 | Mathur |
| 2011/0137945 | A1 | 6/2011 | Sandblom |
| 2014/0278271 | A1 | 9/2014 | Stevenson et al. |

OTHER PUBLICATIONS

McEvoy_2012 (Stacking Plan Software Overview and Demonstration, https://www.youtube.com/watch?v=Ruk7UGO0nts Jun. 26, 2012).*

Carlyle_2012 (http://web.archive.org/web/20120715000000*/http://www.carlylecondo.com/stacking.html 2012).*

Jeer_1997 (Traditional Color Coding for Land Uses, Dec. 13, 1997 http://www.planning.org/pInginfo/lbcs/index.html).*

SmartDraw_2009 (Smart Draw User's Guide Version 2009).*

McEvoy_2012 (Stacking Plan Software Overview and Demonstration, https://www.youtube.com/watch?v=Ruk7UGO0nts Jun. 26, 2012). (Year: 2012).*

Carlyle_2012 (http://web.archive.org/web/20120715000000*/http://www.carlylecondo.com/stacking.html 2012). (Year: 2012).*

Jeer_1997 (Traditional Color Coding for Land Uses, Dec. 13, 1997 http://www.planning.org/pInginfo/lbcs/index.html) (Year: 1997).*

SmartDraw_2009 (Smart Draw User's Guide Version 2009). (Year: 2009).* www.pbtnow.com; "Stacking Plan Software Was Designed by Commercial Property Managers to Create and Maintain Stacking Plan Profiles in a Simple, Flexible and Economical Manner", 1 pg.

www.winstack.com; 1 pg.

www.leosoftware.net; "Stacking Plan"; 1 pg.

www.ssctech.com; "Real Estate Stacking Plan Software"; 1 pg.

www.veribrum.com; "Stacking Plans That Make You Look Good"; 1 pg.

www.stackingplans.net; "Stacking Plans"; 1 pg.

www.info.ascendix.com; 1 pg.

www.plandata.com; "Plan Data"; 1 pg.

www.spacedatabase.com; Tru-Measure Data Maintenance; 1 pg.

www.planimetron.com; "The Visual Decision Support System for Real Estate Professionals"; 1 pg.

www.yardi.com; "Sunrise Tower—Commercial Property Manager Database"; 1 pg.

www.replans.com; "Stacking Plans"; 1 pg.

www.mrisoftware.com; "MRI Workspeed Add-Ons"; 1 pg.

www.argussoftware.com; "Stacking Plans"; 1 pg.

www.quickbase.intuit.com; QuickBase Database Plans & Pricing; 1 pg.

MS Excel; 1 pg.

www.aoncenter.com; "AON Center Stacking Plan"; 1 pg.

www.archidata; "Space Management"; 1 pg.

* cited by examiner

STACKING PLAN

Settings  Users  Contact Support  Logout

ACCOUNT SETTINGS

Your Company Name:

Create your STACKING PLAN web address
(Letters and numbers only. No spaces)

http:// [         ] .stacktower.com

CREATE THE ACCOUNT OWNER

First Name:

Last Name:

Email Address:

[ SUBMIT ]   [ CANCEL ]

FIG. 2A

STACKING PLAN

Settings   Users   Contact Support   Logout

CREATE USER ACCOUNT

Login: _____ 36a

Display Name: _____ 36b

Password: _____ 36c

Audience: _____ 36d

38b — ☐ Enabled
This account is enabled and can log into this website. Only administrators can enable or disable accounts.

38a — ☐ Disabled
After creating this account, send an e-mail invitation to this member with login and password information.

First Name: _____ 36e

Last Name: _____ 36f

Email Address: _____ 36g

40 — [ CREATE USER ]   [ CANCEL ] — 30

| | | |
|---|---|---|
| ≡ STACKING PLAN | Settings  Users  Contact Support  Logout | |

ADD BUILDING

| | | |
|---|---|---|
| Building Name: | 1150 18th Street NW | —78a |
| Landlord: | Rockrose Development | —78b |
| Street Address: | 1150 18th Street NW | —78c |
| Street Address II: | | —78d |
| City: | Washington | —78e |
| State: | District of Columbia | —78f |
| Zip: | 20036 | —78g |
| Country: | United States | —78h |
| Number of Floors: | 10 | —78i |
| Year Build/Renovated: | 1990 | —78j |
| LEED Certification | NONE | —78k |
| Total Gross Area: | 183,016 | —78l |
| Total Cert. Rentable Area: | 171,327 | —78m |
| Total Curr. Rentable Area: | 130,000 | —78n |
| Total Cleanable Area: | 135,895 | —78o |
| Sale Price: | $43.8 Million | —78p |
| Sale Price PSF: | $250 PSF | —78q |
| Add Custom Field: | | —78r |

[ SAVE BUILDING ]   [ CANCEL ]
      82              30

FIG. 3

STACKING PLAN

BUILDING NAME
1150 18th Street NW

BUILDING DETAILS

| | |
|---|---|
| Street Address: | 1150 18th Street NW |
| City: | Washington |
| State: | District of Columbia |
| Zip: | 20036 |
| Country: | United States |
| Landlord: | Rockrose Development |
| No. of Floors: | 10 |
| Year Built: | 1990 |
| LEED Certification | None |
| Total Gross Area: | 183,016 |
| Total Cert. Rentable Area: | 171,327 |
| Total Curr. Rentable Area: | 130,000 |
| Total Cleanable Area: | 135,895 |
| Sale Price: | $43.8 Million |
| Sale Price PSF: | $250 PSF |

Settings  Users  Contact Support  Logout

ADD STACK
You have successfully added a new building. Do you want to add a new stacking plan?

[ADD NEW STACKING PLAN]   [GO TO NEW BUILDING]

FIG. 5

| 100a | 100c | 100b | |
|---|---|---|---|
| 1 | 150 | Halcombe Coffee Company | ... |
| 1 | 100 | Ocean Bank Reserves | |
| 1 | 170 | Vacant | |
| 5 | 540 | Samsa Technology | |
| 5 | 525 | Willers Group | |
| 5 | 500 | John Galt Partners | |
| 5 | 550 | Vacant | |
| 6 | 625 | Keating Corporate Solutions | |
| 6 | 600 | Wynand & Sons | |
| 6 | 650 | J. Shulman Company | |
| 7 | 700 | Atwood Logistics | |
| 8 | 800 | Atwood Logistics | |
| 9 | 910 | SPADE, INC | |
| 9 | 960 | Tom Ripley Real Estate Advisors | |
| 9 | 925 | Zuckerman Swift, LLC | |
| 9 | 900 | Donnigon & Associates | |
| 9 | 950 | Vacant | |
| 10 | 1000 | Anconia Industries | |
| 10 | 1020 | Vacant | |
| 11 | 1125 | The Gregor Group | |
| 11 | 1100 | Bascom Financial | |
| 11 | 1150 | Vacant | |
| 12 | 1200 | Austen Heller Company | |
| 12 | 1250 | Barnes & Smiley LLP | |
| 13 | 1300 | Vacant | |
| 14 | 1400 | Francon Corporation | |
| 15 | 1500 | Akston & Toohey, LLP | |
| 16 | 1610 | Eisenstaedt Intellectuals | |
| 16 | 1680 | Kent Lansing Attorney at Law | |
| 16 | 1660 | Leopold Bloom | |
| 16 | 1650 | Dagny Edwin, LLC | |
| 16 | 1655 | George & Jake LLP | |
| 16 | 1690 | Rearden, Ferris & Mouch | |

FIG. 7

INTERACTIVE BUILDING STACKING PLAN USER INTERFACE

CROSS-REFERENCE TO RELATED APPLICATIONS

The present application is a continuation-in-part application of U.S. patent application Ser. No. 13/842,190 filed Mar. 15, 2013 entitled "INTERACTIVE BUILDING STACKING PLANS," the entirety of the disclosure of which is wholly incorporated by reference herein.

STATEMENT RE: FEDERALLY SPONSORED RESEARCH/DEVELOPMENT

Not Applicable

BACKGROUND

1. Technical Field

The present disclosure relates generally to information systems for commercial real estate, in particular, building ownership, unit or suite ownership, asset management, financial institutions, real estate brokerages, architecture, and building measurement. More particularly the present disclosure relates to interactive stacking plans for the customized visualization of buildings, its occupants, and other real estate information pertaining thereto.

2. Related Art

Property management, particularly that involving commercial real estate such as office buildings, retail space, industrial facilities, apartment buildings, and so forth, encompasses diverse functions performed by several different parties. Fundamentally, a commercial real estate lease involves a tenant or owner that occupies the space/property of an owner in exchange for the payment of rent or payment for purchase. However, between the tenant and occupier owner and the building owner, there may be a broker that serves as an intermediary with respect to marketing and sales of property, unit or suite, and handles the detailed contractual negotiations with the tenant or suite, unit owner on behalf of either the building owner or the tenant or current unit owner. This may apply to purchase transactions between owners and buyers of a suite or unit, governmental agencies, municipalities, or entities using the information for tracking purposes.

There may be a property manager that tracks occupancy and availability to correctly and most efficiently allocate available space to existing and new tenants, units for purchase or occupied. The property manager may also be involved with architects and engineers in the planning, designing, and customizing the space as desired by the tenant or unit owner. Other functions such as maintenance and operations may be provided, as well as management of the property-level financial matters including collection of rent payments, collection of deposit for purchase and/or collection of mortgage payments and disbursements to third party service providers.

Where a building owner holds a number of different properties or units/suites for investment purposes, asset managers may be engaged thereby. In particular, the asset managers may perform short and long term financial planning/forecasting, oversee new constructions and acquisitions, as well as dispose of existing units/suites and properties failing to meet financial performance objectives. The management complexity, and hence the need for dedicated asset managers, may increase with the addition of further properties across disparate cities, counties, states, and countries into the portfolio.

Each of the aforementioned parties involved in commercial real estate have a need for updated and accurate information regarding the properties of interest. For instance, the broker depends on knowing which of the spaces or unit in the buildings are available to potential clients, as well as how much space in which configuration, so that a space meeting the client's exact needs can be offered for lease or purchase. The property manager likewise depends on vacancy and occupancy information for planning and allocation tasks. These functions oftentimes require a high level of detail including the exact measurements of square footage or square meters from a building calculation report and the floor drawings of the leased or purchases and available spaces. Furthermore, information unrelated to physical space allocation, such as lease terms, purchase agreements, contracts documents, cost of operations, and the like may also be needed by the property manager. In customizing the leased space for a tenant, besides the property manager, the subcontracted architects and engineers also requires building and tenant improvement drawings and occupancy related information. Such extensive levels of detail, however, may not be needed at higher management levels such as the asset manager or the owner, and a concise visual overview of the building and its occupancy may suffice.

One of the most common ways in which space and occupancy in buildings is represented is a stacking plan or diagram, which is a two-dimensional chart divided into floors of the building. Each floor depicts the tenants or units thereof and their respective leased or purchased square footage or square meter as blocks. For simpler buildings with only a few floors and tenants or occupants, stacking plans or diagrams are developed in spreadsheet applications based on tables that contain accounting information. Each cell within the table may be representative of a space, or units of space proportionally occupied by the tenant or occupant owner, and may be color-coded based on lease expiration dates, ownership or other metrics. Aside from being able to edit the information in the spreadsheet by virtue of being opened in a spreadsheet application, there is little interactivity, and additional information that would otherwise be useful for the aforementioned management functions is not immediately accessible. Along these lines, making substantial changes tends to be a cumbersome process or impossible. For buildings or properties of higher complexity, dedicated stacking plan applications with additional functionality beyond what is possible with spreadsheets are also available.

Although various development efforts have been directed to improved data sharing and consistency with respect to updates to stacking plan, existing solutions remain deficient in several ways. As mentioned above, personnel at different management or ownership levels have access to and have a need for varying levels of detail, but a unified and consistent presentation thereof is currently not possible, especially in real time. Furthermore, any discrepancies between different sources of this information are unaccounted for. Accordingly, for these reasons and more, there is a need in the art for improved interactive building stacking plans.

BRIEF SUMMARY

In accordance with one embodiment of the present disclosure, a method for generating an interactive stacking plan of a building with one or more floors with leasable or sellable space is contemplated. The interactive stacking plan may be generated on a server computer system for rendering on a client computer system. The unique visual representation of the interactive stacking plan is understood to present a unified view of buildings and their occupants or ownerships.

Another embodiment contemplates a method for presenting an interactive stacking plan of a building with one or more floors of leasable or available for purchase space on a client computer system. The method may include transmitting a request for stacking plan graphical elements from the client computer system to the server computer system. Each of the stacking plan graphical elements may correspond to a leased or purchased space represented by a master tenant or occupant record defined by a plurality of tenant or occupant record attributes including at least a floor identifier attribute, a tenant or occupant identifier attribute, and a leased or ownership space identifier attribute. The tenant or occupant record may be stored in a master building database in communication with the server computer system. The method may also include receiving the stacking plan graphical elements on the client computer system, followed by generating an output of the stacking plan graphical elements for each of the master tenant or occupant records with a size proportional to a leased or owned space specified in the leased or owned space identifier attribute and a user-activatable link that generates an independent display of at least one of the master tenant or ownership record attributes. The stacking plan graphical elements being arranged according to the floor identifier attributes of the corresponding master tenant or ownership records. Each row may be associated with a particular value of the floor identifier attributes of a set of master tenant or ownership records.

In one variation, the method may include receiving an input corresponding to a modification of a horizontal size of a first one of the stacking plan graphical elements. This may be followed by adjusting the horizontal size of the first one of the stacking plan graphical elements without revising the leased or ownership space identifier attribute of a corresponding first one of the master tenant or ownership records.

In another variation, the method may include receiving an input corresponding to a movement of a first one of the stacking plan graphical elements from a first row to a second row. The method may proceed to visually removing the first one of the stacking plan graphical elements from the first row. Additionally, there may be a step of visually adding the first one of the stacking plan graphical elements to the second row.

Certain other embodiments of the present disclosure contemplate respective computer-readable program storage media that each tangibly embodies one or more programs of instructions executable by a data processing device to perform the foregoing method. The present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which:

FIG. 2A-2E are screen captures of exemplary account management pages generated by a stacking plan application system in accordance with the present disclosure;

FIG. 3 is a screen capture of a building definition page;

FIG. 5 is a screen capture of an add stack page;

FIG. 7 is an example spreadsheet that is stored in a building data file and imported in accordance with various embodiments of the present disclosure;

Common reference numerals are used throughout the drawings and the detailed description to indicate the same elements.

DETAILED DESCRIPTION

The detailed description set forth below in connection with the appended drawings is intended as a description of the presently preferred embodiment of the interactive building stacking plans, and is not intended to represent the only form in which the present disclosure may be developed or utilized. The description sets forth the functions and the sequence of steps for the development and operation of the illustrated embodiment. It is to be understood, however, that the same or equivalent functions and sequences may be accomplished by different embodiments that are also intended to be encompassed within the scope of the present disclosure. It is further understood that the use of relational terms such as first, second, and the like are used solely to distinguish one from another entity without necessarily requiring or implying any actual such relationship or order between such entities.

Various embodiments of the present disclosure contemplate systems to create visual representations of a building, its occupants, and other real estate and construction drawings. Reference to the term "building" in the illustrative examples of this disclosure is not intended to be limiting, and is understood and is understood to refer to any block of real estate that can be illustrated with a stacking plan or diagram. Furthermore, the features disclosed herein, notwithstanding naming conventions incorporating these terms, does not depend on whether a particular space is leased or purchased. For example, reference will be made to a stacking plan corresponding to a leased space, but it is also intended to encompass a purchased or owned space as well. Thus, leased or purchased are intended to be interchangeable, as are tenant and occupant, and so forth. Along these lines, features that are particular to commercial real estate transactions will be considered, but this is likewise by way of example only, and those having ordinary skill in the art will readily ascertain the needed modifications to the presently disclosed system to adapt the same to alternative contexts.

Figure 1:
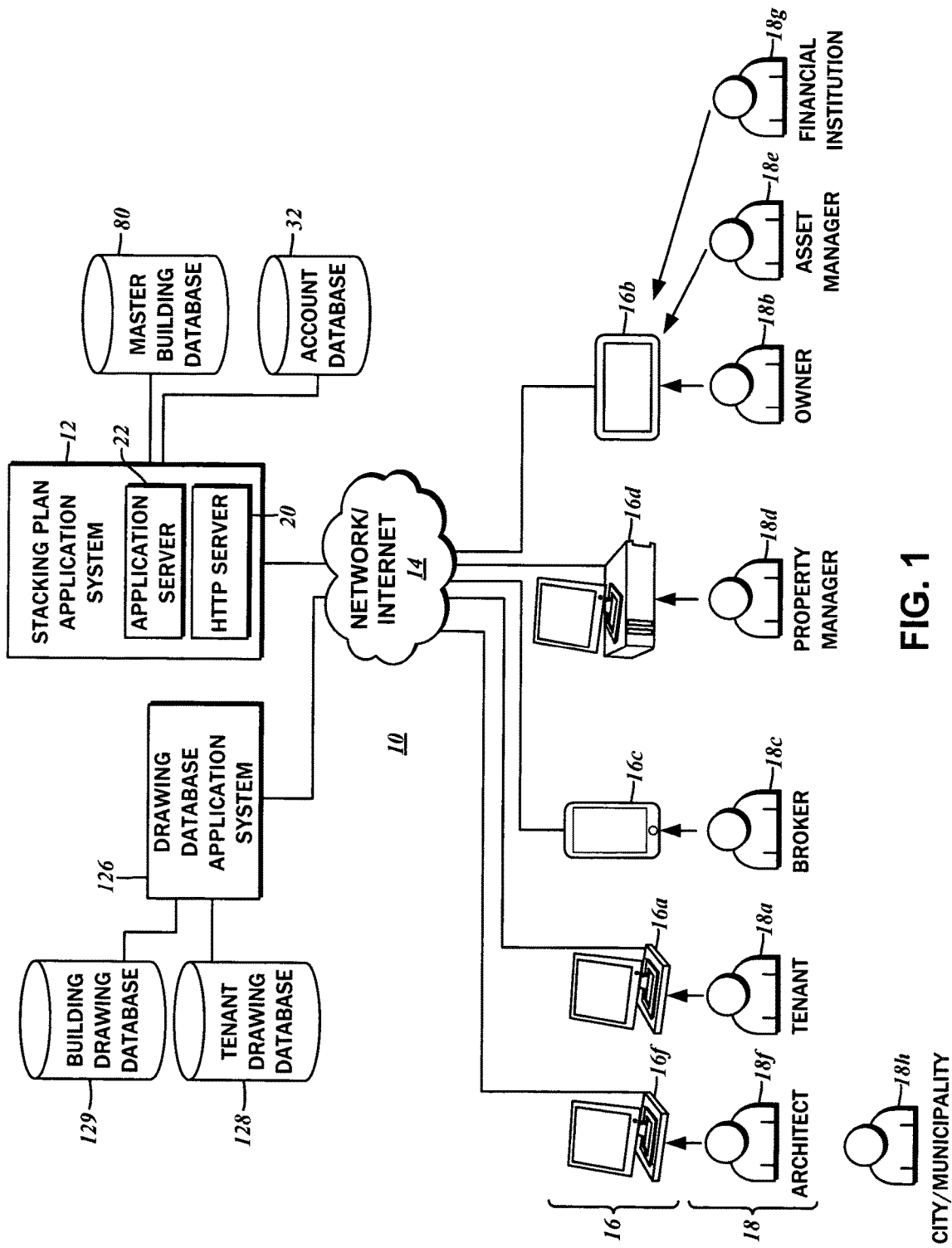
FIG. 1 is a block diagram illustrating one possible environment in which various embodiments of the interactive stacking plan may be implemented.

Generally, the stacking diagrams are generated on computers, and rendered on computers. The block diagram of FIG. 1 illustrates an exemplary networked computing environment 10 in which various embodiments of the present disclosure may be implemented. There is a stacking plan application system 12 that has non-transitorily stored thereon computer-executable instructions that embody the several methods for generating the interactive building stacking plans. In further detail, the stacking plan application system 12 is connected to a network 14, which may be the Internet, for various client computer systems 16 that are likewise connected to the network 14 to communicate and conduct various data exchange transactions with the stacking plan application system 12.

As indicated above, the typical commercial real estate environment involves several different personnel, each performing a different role. In the context of the stacking plan application system 12, such personnel may also be referred to as users 18 thereof. At the most basic level, there may be a tenant 18a that is or is planning to lease building space from an owner 18b. The owner 18b may retain a broker 18c that negotiates with the tenant 18a to reach mutually agreeable leasing terms, as well as a property manager 18d that tracks building occupancy and allocates available space to different tenants 18a, among several other functions. There may be an architect 18e that customizes the interior of the leased or purchased space, as well as a city or municipality 18g that is involved for permitting purposes. Furthermore, the owner 18b may retain an asset manager 18e for high level planning and management of multiple properties. Along these lines, there may additionally be a financial institution 18g involved. Notwithstanding the foregoing, however, the identity of the users 18 is presented by way of example only. Any other class of personnel may be involved in property management activity that involves interaction with the stacking plan application system 12. Notwithstanding the limited enumeration of users 18 above, many others may be involved in the building construction and management process.

Each of these users 18 has access to respective client computer systems 16. For example, the tenant or occupant 18a may utilize a desktop client computer system 16a, while the building owner 18b and the asset manager 18e may utilize a tablet client computer system 16b. The broker may utilize a mobile client computer system 16c such as a smart phone, and the property manager 18d may utilize a desktop client computer system 16d. Across these diverse platforms, the one commonality is that each of the client computer systems 16 has a data communications modality and a general purpose processor that can run software applications, including a web browser application, and display information on an output screen.

Accordingly, in one embodiment of the present disclosure, the stacking plan application system 12 may be functionally segregated into a web or HTTP server 20 and an application server 22. As will be recognized by those having ordinary skill in the art, the primary function of the HTTP server 20 is to receive and respond to HyperText Transfer Protocol (HTTP) requests originating from the respective web browser applications of the client computer systems 16. The higher level functionality of generating the stacking plan is handled by the application server 22. In this regard, the software application therefor is implemented as a remote service, and is understood to present a consistent, unified interface to the users 18 that does not depend on the specifics of the client computer systems 16 because it is rendered within the web browser application.

Considering that the stacking plan application system 12 is implemented as a remote service, it is possible for multiple enterprises to separately manage their respective properties using their own data and customizations. To this end, each enterprise is understood to be assigned an enterprise account. Each enterprise account may have multiple buildings or stacking plans associated therewith. With reference to the screen capture of FIG. 2A, an enterprise account setup page 24 includes a text input box 26a that receives a user input of a company or enterprise name. Direct Uniform Resource Locator (URL) access to the section of the stacking plan application system 12 that is specific to the enterprise is possible, and a so third level domain can be entered in a text input box 26b. The second level domain, stacktower.com, is already defined.

One user 18 that is responsible for administering the enterprise account can also be specified. The example enterprise account setup page 24 requests minimal information of a first name entered into a text input box 26c, a last name entered into a text input box 26d, and an e-mail entered into a text input box 26e. However, it will be appreciated that additional information may be requested if deemed necessary for system administration purposes. Once the requested information is entered into the respective text input boxes 26a-e, a submit button 28 may be pressed to commit the entries to the stacking plan application system 12. Otherwise, pressing a cancel button 30 will discard the data. As shown in the block diagram of FIG. 1, the stacking plan application system 12 may be linked to an account database 32, which stores the data for the enterprise account including those mentioned above.

For each enterprise account, there may be multiple users 18 that are given access thereto. As will be recognized by those having ordinary skill in the art, user-level permissions may be set so that each user 18 is only permitted access to add, modify, or delete data to the extent necessary, and activities on the stacking plan application system 12 may be individually tracked. Various embodiments of the present disclosure therefore contemplate the setup and management of user accounts. One way to set up a user account is shown in FIG. 2B, which depicts a user account setup page 34. A login identifier for specifying the particular user account to which user 18 desires to login is entered into a text input box 36a, while a display name (possibly different from the login identifier) is entered into a text input box 36b. A password may be set for the user account in a text input box 36c. Further identifying information such as a first name, a last name, and an e-mail address may be entered in text input boxes 36e, 36f, and 36g, respectively.

It is contemplated that different users 18 may be assigned a group or audience, each of which defines a set of default permissions therefor. For instance, if the broker 18c is assigned to the "broker" audience, then permissions granted specifically thereto are also transitively assigned to the specific user account for the broker 18c. The specific audience assignment for the user account may be entered into a text input box 36d. Additional details pertaining to the audience assignment will be discussed more fully below.

In some cases, because a different administrative user is setting up the user account, it may be beneficial to require the new user to initially enter a desired password. This way, the administrative user need not enter the password on behalf of the new user, and further, communicate the same thereto over potentially unsecure channels. Accordingly, a disabled account flag may be set with a first checkbox 38a. Saving this value is operative to generate an e-mail communication to the specified address that the stacking plan application system 12 is awaiting setup completion, i.e., initial entry of a password. In the alternative, an enabled account flag may be set with a second checkbox 38b, allowing the user to login with the password as entered by the administrator.

User account setup may be completed by activating a create user button 40, or cancelled, with the aforementioned data input discarded, by activating the cancel button 30. The aforementioned data entered into the user account setup page 34, like the data for the enterprise account mentioned above, may be stored in the account database 32.

Figure 2C:
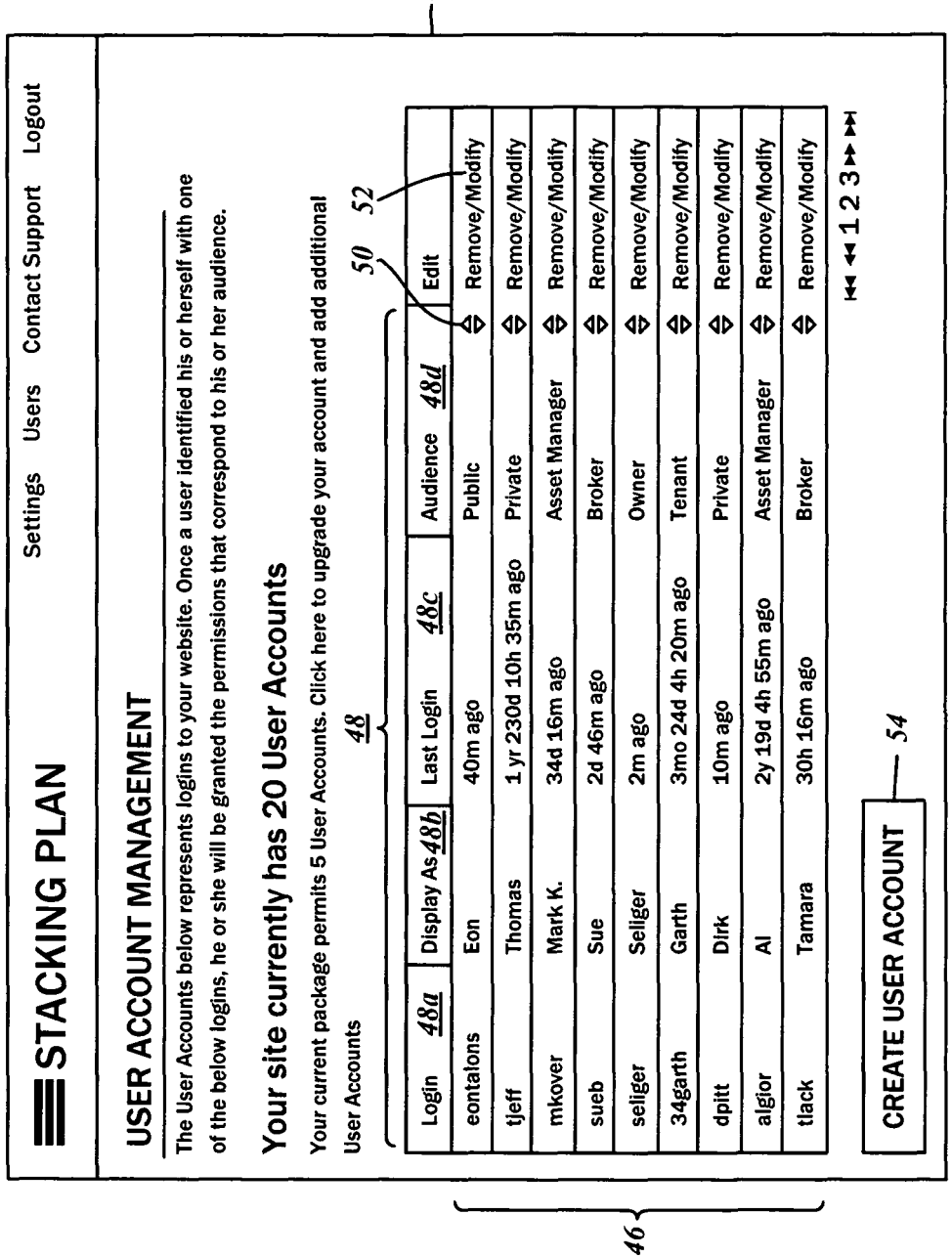

With reference to FIG. 2C, managing multiple user accounts at once is also possible, via a user account management page 42 depicted therein. More particularly, there is an account table 44 in which each row 46 corresponds to one user account, and each column 48 corresponds to a data element of the user account. For instance, a first column 48a shows the login identifier provided in, for example, the text input box 36a in the user account setup page 34 discussed above. Furthermore, a second column 48b shows the display name similarly provided in the text input box 36b. A third column 48c is a representation of the last time the user accessed the stacking plan application system 12, while a fourth column 48d shows the particular audience assignment of the user. Quick changes to this attribute can be made by activating a pull-down button 50, which generates a list of existing audience attribute assignments currently existing on the stacking plan application system 12 and stored in the account database 32. Further revisions to the user account can be made by invoking the user account setup page 34 upon activating a remove/modify hyperlink 52. If it is necessary to add a new user account, then another create user account button 54 may be activated to also invoke the aforementioned user account setup page 34.

Figure 2D:
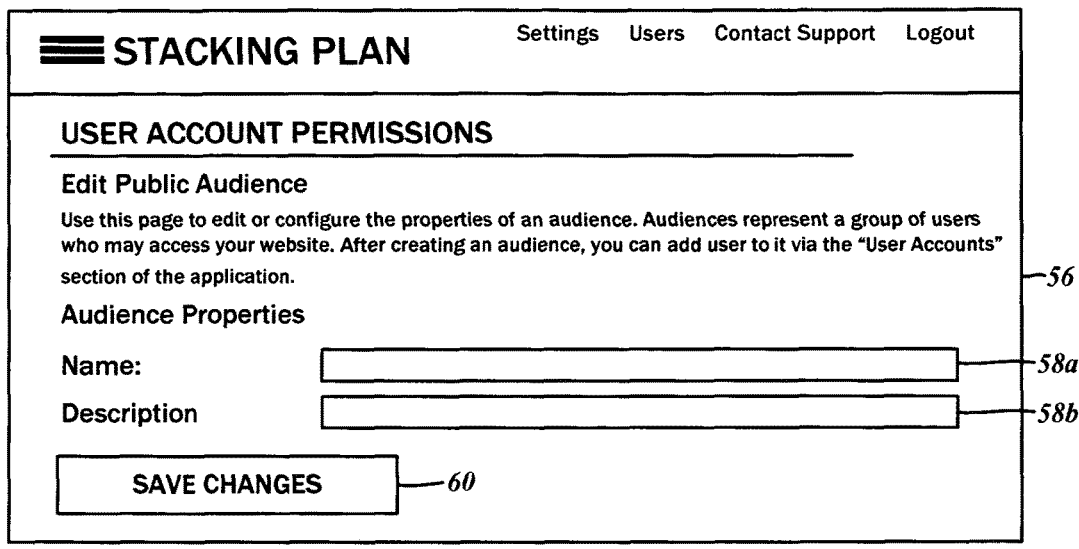
Figure 2E:
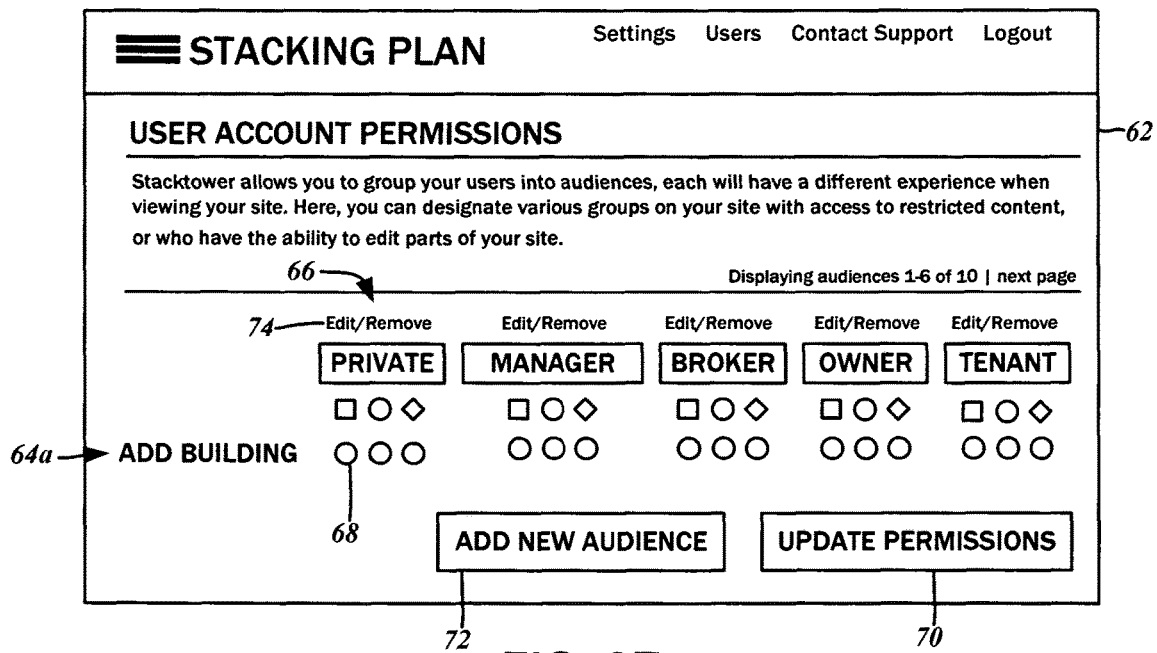

As indicated above, different users 18 may be assigned to a permissions group, also referred to as an audience. As shown in FIG. 2D and its audience definition page 56 an audience can be defined generally in terms of a name, entered into a text input box 58a, and a descriptor thereof, entered into a text input box 58b. Changes can be committed with a save changes button 60. What those audience members are specifically permitted to do can be defined via an audience permissions definition page 62 that is shown in FIG. 2E. The various audiences and associated permissions are arranged in a table organized by rows and columns, with each row 64 corresponding to a particular action that is permitted, e.g., adding a new building. Each column 66 represents the particular audience, including the aforementioned tenant 18a, owner 18b, broker 18c, and a property manager 18d. An additional audience referred to as "private" has also been defined. A series of radio buttons 68 can be used to set different permitted or disallowed actions, and any changes in selection made thereto can be committed by activating an update permissions button 70. A new audience can be added by activating an add new audience button 72. Editing the definition of the audiences can be achieved by activating an edit hyperlink 74 for the corresponding audience that is to be edited. This is understood to invoke the aforementioned audience definition page 56 shown in FIG. 2D.

In accordance with one embodiment of the present disclosure, a method for generating an interactive stacking plan is contemplated. The interactive stacking plan is understood to be generated on the stacking plan application system 12 and is subsequently transmitted to one of the client computer systems 16 for rendering and interaction thereon. The method and system are envisioned to assemble such visual representation of the office building from data fields such as the square footage of an office suite. Notwithstanding the specific reference to square footage herein, it is also intended that square meters, or any other unit of area measurement be encompassed within such term.

Since stacking plans are typically associated with a building, one of the initial precursor steps is defining the building and associating the same with the enterprise account. With reference to the screen capture of FIG. 3, a building definition page 76 includes a plurality of text input boxes 78a-78r, with which the basic attributes of the building may be defined. These attributes include the building name, the landlord name, and the building address (including street, city, state, zip code, and country). Additionally, certain general characteristics of the building such as the number of floors, year built, LEED (Leadership in Energy and Environmental Design) certifications, gross square footage or square meter, certified and current rentable square footage, and cleanable square footage or square meter may be defined. Financial information such as sale price and price per square foot or square meter are also part of set. Once the information is entered, the changes may be saved to a master building database 80 by activating a save building button 82. Alternatively, any additions or deletions with respect to the text input boxes 78 may be cancelled and discarded by activating the cancel button 30. Although specific attributes of the building have been listed herein, these are understood to be by way of example only and not of limitation. More or less attributes can be set via the building definition page 76 depending on the specific needs of the users 18.

Figure 6:
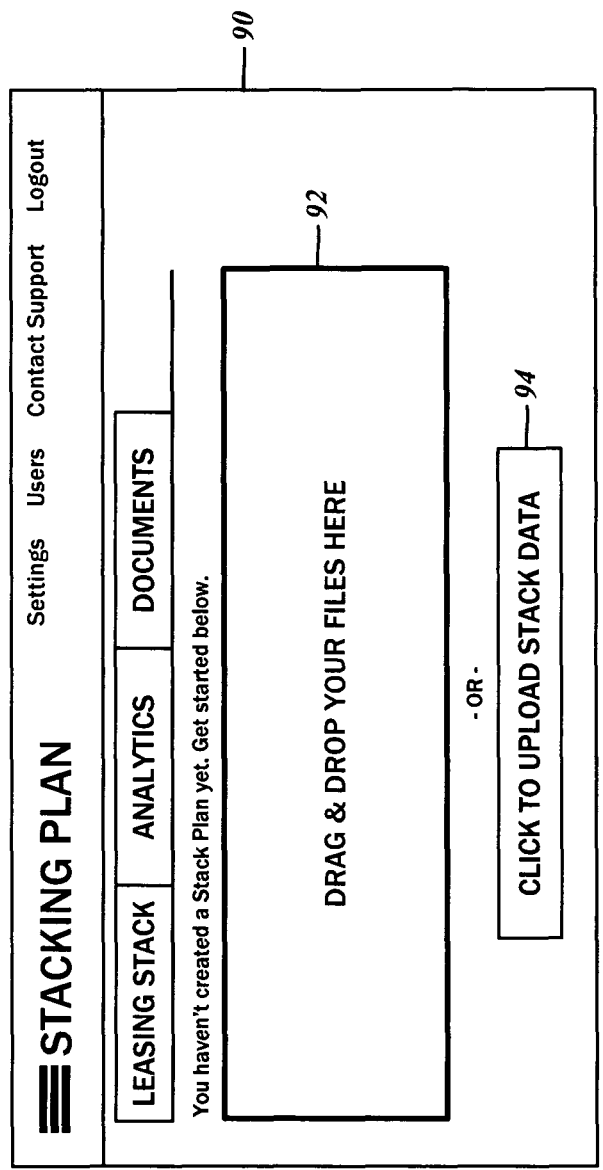
FIG. 6 is a screen capture of a stack upload page.

The method for generating the interactive stacking plan of a building is generally comprised of a series of data import and parsing steps, data analysis steps, and stack plan construction steps. Referring now to the flowchart of FIG. 4, the method may include a step 1000 of receiving a building data file on the stacking plan application system 12. As shown FIG. 5, once the building has been added as described above in relation to FIG. 3, an add stack plan page 84 is generated. A confirmation message that the building has, indeed, been added is shown, and an add new stacking plan button 86 and a go to new building button 88 is generated. Activating the go to new building button 88 is understood to generate a blank stacking diagram as there is no data therefor. However, activating the add new stacking plan button 86 invokes a stack upload page 90, shown in FIG. 6. The add stack plan page 84 further includes a sidebar 91 that displays some of the building attributes that were set in the previous building definition page 76.

Various embodiments contemplate one or more ways in which a building data file can be specified and uploaded to the stacking plan application system 12. One possible modality is a file drop box graphical interface 92 in which icons representative of the building data file as stored on a local file system of the client computer system 16 can be dragged from the operating system interface directly on to the browser window, where the file drop box graphical interface 92 is rendered. Those having ordinary skill in the art will recognize the needed client-side scripting required to implement this functionality. It is understood that once the icon is positioned within the file drop box graphical interface 92, the underlying data file begins uploading to the stacking plan application system 12. Another possible modality is an upload button 94, which is understood to invoke a conventional file system dialog window by which the file and its path can be specified.

The building data file is understood to include one or more external records in a first format. According to various embodiments, the first format is understood to be a spreadsheet such as those generated with Microsoft Excel and Google Docs, though any other format may be substituted without departing from the scope of the present disclosure. The data contained therein may be specific to those spreadsheet applications, but could also be a generic tabular format such as CSV (comma separated values), XML (eXtensible Markup Language), and others. With reference to an example spreadsheet 96, i.e., the building data file, there are one or more external tenant records 98 that are each defined by a plurality of tenant record fields 100. In the spreadsheet 96, each row is understood to correspond to a specific external tenant or occupant record 98, and each column is understood to correspond to specific tenant or occupant record fields.

In the illustrated example, a first tenant or occupant record field 100a may represent a floor identifier field, that is, the floor number on which the tenant or owner is occupying. Furthermore, a second tenant or occupant record field 100b may represent a tenant or occupant identifier field, that is, the identity of the tenant or owner occupying the space. Finally, there is a third tenant or occupant record field 100c that may represent a leased or purchased space identifier field, that is, the suite or unit number of other indicia that sets forth which space the tenant or owner is occupying. The term leased, ownership, space identifier may, however, refer to other fields that similarly define the parameters of the physical space that is leased or purchased by the tenant or occupant, such as square footage or square meter, links to floor plans, and the like—generally any suitable identifier of the leased or purchased space. Furthermore, the foregoing example of the spreadsheet 96 contains a minimal number of fields, but this is for the sake of convenience only in illustrating embodiments of the present disclosure and not of limitation because in most cases, actual spreadsheets 96 will have far more additional fields.

Figure 4:
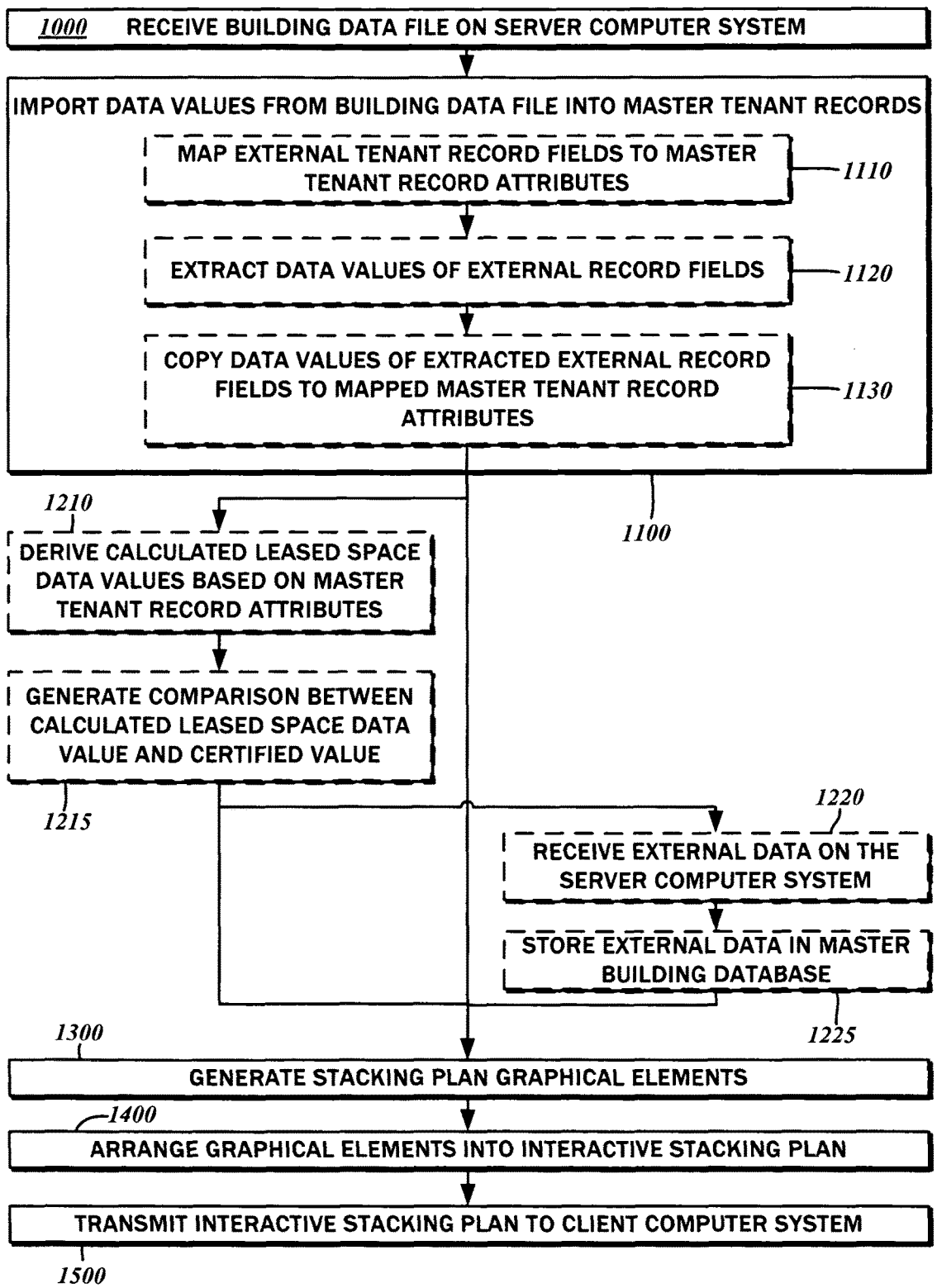
FIG. 4 is a flowchart depicting one embodiment of a method for generating a stacking plan.
Figure 8:
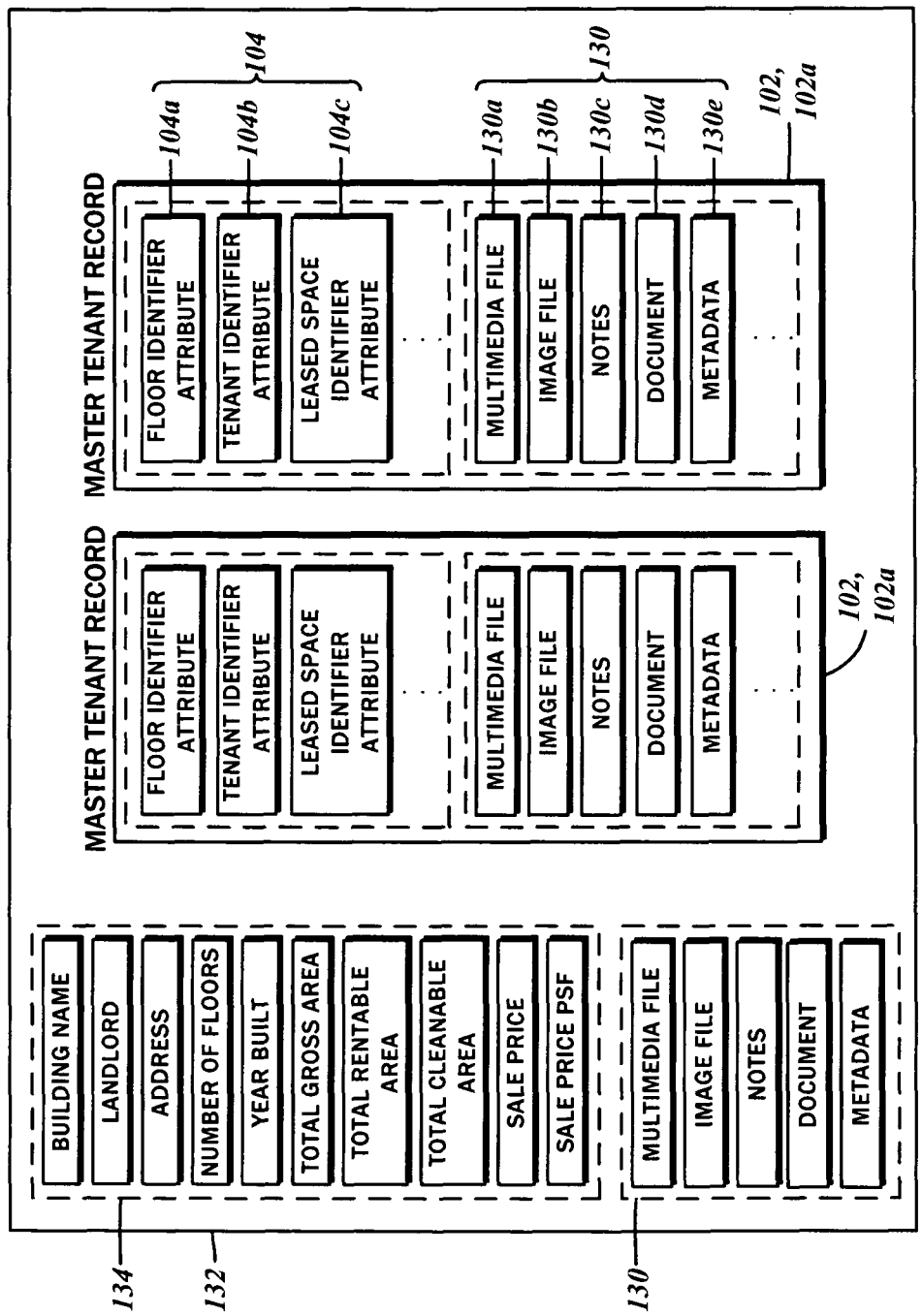
FIG. 8 is a diagram illustrating an exemplary embodiment of master tenant or ownership records and a building record.

Referring back to the flowchart of FIG. 4, the method continues with a step 1100 of importing data values of one or more of the external tenant or occupant record fields 100 into master tenant or occupant records. In other words, the aforementioned spreadsheet data is converted into a common internal format in preparation for generating the stacking plan. One implementation of the master tenant or occupant record 102 data structure is shown in FIG. 8, in which there are multiple master tenant or occupant records 102a, 102b. There are understood to be others, but have been omitted for the sake of brevity. Each of the master tenant or occupant records is defined by a plurality of master tenant or occupant record attributes 104, including a floor identifier attribute 104a, a tenant or occupant identifier attribute 104b, and a lease or purchased space identifier attribute 104c. However, other attributes that define the master tenant or occupant record 102 are also possible, and are understood to be generally the same as the other fields included in the spreadsheet 96. Although the term "attribute" is utilized in relation to data structure elements of the master tenant or occupant record, and the term "field" is utilized in relation to data structure elements of the external tenant or occupant record, this is only to distinguish one from the other. Thus, "field" and "attribute" are utilized interchangeably, and any differences in nuanced meanings are to be of no consequence whatsoever.

Importing the spreadsheet into the master tenant records 102 involves a combination of automation and user custom controls to determine how the data is used to generate the stacking plan. Generally, this involves parsing the external tenant record fields 100 to determine the field structure, and binding the data contained therein to corresponding master tenant record attributes 104. Referring again to the flowchart of FIG. 4, the step 1100 of importing the data values from the building data file may include several underlying steps, beginning with a step 1110 of mapping the external tenant record fields 100 to corresponding master tenant record attributes 104. An association link may be defined between one or more of the external tenant record fields 100 and the corresponding one of the master tenant record attributes 104. As referenced herein, the association link may be any identifier that logically associates a record field to an attribute. In some cases, an exact, character-by-character identity or match between the external tenant record field 100 and the master tenant record attributes 104 may be deemed sufficient to establish an association link.

Figure 9:
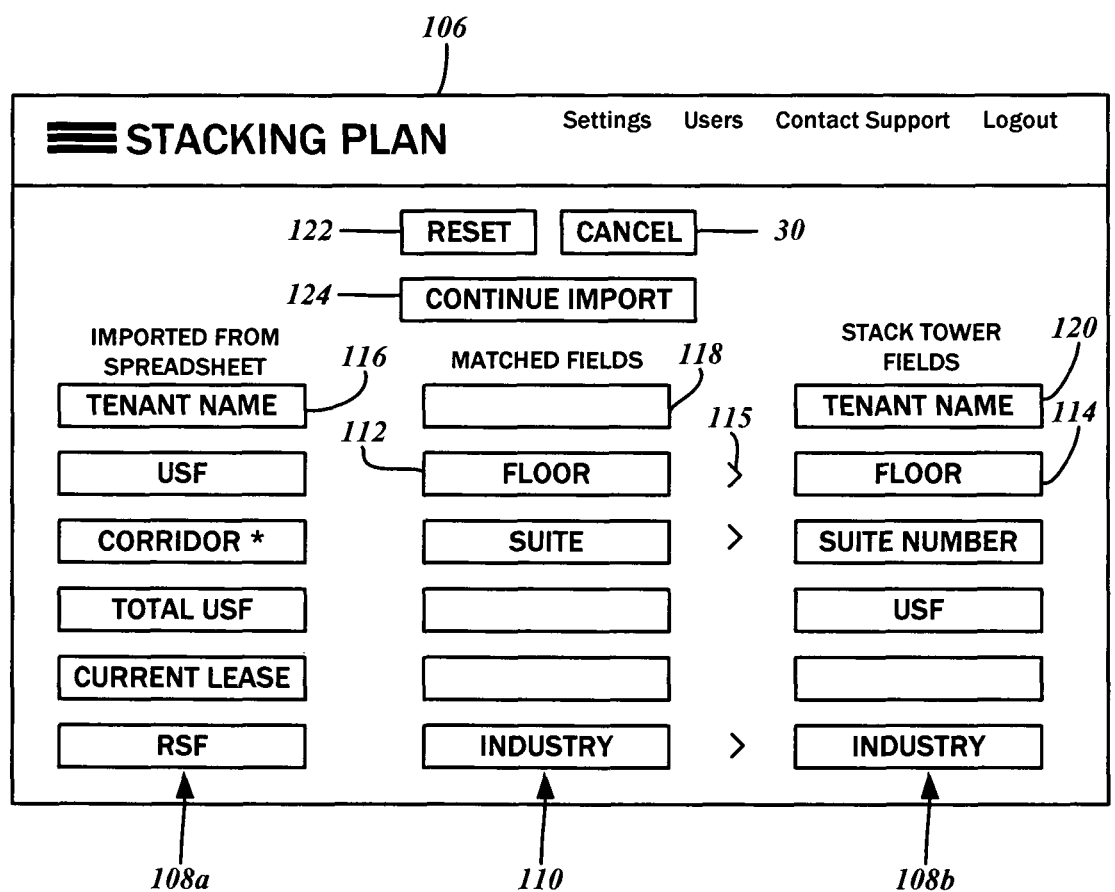
FIG. 9 is a screen capture of a user field mapping page.

It is also possible for the user 18 to define the association link and modify the data import parameters/field mapping before proceeding further. As best shown in the screen capture of a user field mapping page 106 in FIG. 9, there is a first column 108a of blocks that each correspond to the external tenant record fields 100 imported from the spreadsheet 96. There is a second column 108b of blocks, each of which corresponds to the master tenant record attributes 104. Additionally, there is a third column 110 of open slots that visually positions the blocks 108 (from the first column) representative of the external tenant record fields 100 in lateral adjacency to the corresponding blocks 108 representative of the master tenant record attributes 104, which are in the second column. For example, a "floor" external tenant or occupant record field block 112 is laterally adjacent to the "floor master tenant or occupant record attribute block 114, means that there has been an association link established between such field and attribute. This is further indicated by an arrow icon 115. The blocks in the first column are understood to be interactive, and the user can move them to any open or unoccupied slot in the third column 110. In yet another example, a "tenant or occupant name" external tenant record field block 116 block can be moved to a slot 118, and a mapping of that record field block to the correspondingly specified "tenant or occupant name" master tenant or occupant record attribute block 120 can be made. To undo any changes made in the field/attribute mappings, a reset button 122 can be pressed. To cancel any changes and return to some earlier page, the cancel button 30 may be activated. Once the desire association links have been specified, a continue import button 124 may be activated.

Returning to the flowchart of FIG. 4, the step 1100 of importing data value additionally includes a subsequent step 1120 of extracting data values of the external tenant record fields 100 from the building data file. Then, according to a step 1130, these data values are copied to the mapped master tenant record attributes 104. A specific way to implement the step 1110 of importing data values has been disclosed, but it will be recognized by those having ordinary skill in the art that alternative techniques are also possible. In this regard, the foregoing discussion is not intended to be limiting, and the method for generating the stacking plan does not require the use of the aforementioned importing steps. Other suitable alternatives may be readily substituted without departing from the present disclosure.

It is expressly contemplated that multiple sets of building data for the same building may be imported in accordance with the methodology considered above. Information therein will be separately handled as a different master tenant or occupant record, but the general process of importation is understood to be the same. Visualization of the stacking plans can switch between such multiple sets of building data, while retaining all customization and input controls.

Once the master building database, and in particular, the master tenant or occupant records 102 have been populated in accordance with the foregoing steps, various embodiments of the present disclosure contemplate several data analysis steps. As an initial step, the data values in the master tenant records 102 may be reviewed for key data points such as usable square footage (USF) for each floor in the building. With reference again to the flowchart of FIG. 4, the method may continue with a step 1210 of deriving calculated leased or purchased space data values based upon at least one of the plurality of master tenant or occupant record attributes 104. One of the leased or purchased space data values may be the usable or owned square footage for a particular floor or for a particular tenant or occupant.

The method may continue with a step 1215 of generating a comparison between a first one of the calculated leased space or occupant data values and a corresponding certified value. As referenced herein, certified means a qualified set of measurements. The certified value may be retrieved or derived from an external source. As shown in the block diagram of FIG. 1, it is contemplated that the stacking plan application system 12 communicates with a drawing database application system 126 over the network 14. Generally, a tenant or occupant drawing database 128 contains architectural plans for a wide range of structures, and is indexed according to address and other unique identifiers. As suggested by its name, the tenant or occupant drawing database 128 is related to the individual planning of suites or unit and leased or purchased space by the tenant or occupant. More broadly, drawings for a building in its entirety may be stored in a building drawing database 129. Likewise, the architectural plans are indexed according to address and similar identifiers. Based upon a query for a particular suite or unit and building address generated by the stacking plan application system 12, detailed floor plans, and possibly other information such as usable space measurements, is retrievable from the drawing database application system 126. According to one embodiment of the present disclosure, the Drawing Vault system from Stevenson Systems may be utilized. The measurement data available from the drawing database application system 126 is understood to be certified and more accurate because professional measurement experts produced such data. The calculated leased or purchased space data values, on the other hand, may not be as accurate because they are user-generated. Additional details regarding how any differences are visualized in the stacking plan will be considered more fully below.

The stacking plan application system 12 contemplates the storage and presentation of additional information beyond the stacking plans themselves. As shown in the flowchart of FIG. 4, the method may include an optional step 1220 of receiving external data on the stacking plan application system 12. External data as referenced herein is understood to include images and multimedia content, as well as notes and metadata that are generated by the stacking plan application system 12. Various documents relevant to a particular tenant or occupant, such as floor plans, mechanical drawings, leases, purchase agreements and financial documents are also understood to be external data that can be associated with master tenant or occupant records 102. Furthermore, photographic walkthrough image sequences spatially linked to particular locations on the floor plan may also be associated with master tenant or occupant records 102. With reference to the data structure diagram of FIG. 8, each master tenant or occupant record may also include a storage area and/or reference to one of a multimedia file 130a, an image file 130b, user-generated notes 130c, a document 130d, and system-generated metadata 130e. Thus, it is contemplated that the external data is stored in association with the designated one of the master tenant or occupant records 102. Rather than being associated with one master or occupant tenant record 102a, they may be associated with the building in its entirety.

As shown in FIG. 8, a building record 132 may serve as the container data structure for the master tenant or occupant records 102, as well as for the information that were entered in the building definition page 76, referred to collectively as building attributes 134. The transfer and designation of the files therefor is understood to be the same as the transfer of the building data file demonstrated in the stack upload page 90 with reference to FIG. 6. After receiving the external data, whichever format they may be in, the method continues with a step 1225 of storing the same in the master building database 80. Additional details regarding the presentation of the external data will be considered more fully below.

Referring again to the flowchart of FIG. 4, the method continues with a step 1300 of generating stacking plan graphical elements. According to one embodiment, these are generated from the master tenant records 102 and are understood to have a size that is proportional to the actual leased space as specified in the leased space identifier attribute noted above. The graphical element may be a box, and a single side-by-side group thereof is understood to represent a floor of occupied and/or unoccupied, purchased and/or unpurchased space. Thereafter, in a step 1400, the graphical elements are arranged according to different floors as specified by respective floor identifier attributes of the master tenant or occupant records 102. In particular, each floor is stacked accordingly to visually represent a multistory tower. Any other suitable graphical element may be substituted, however.

Figure 10:
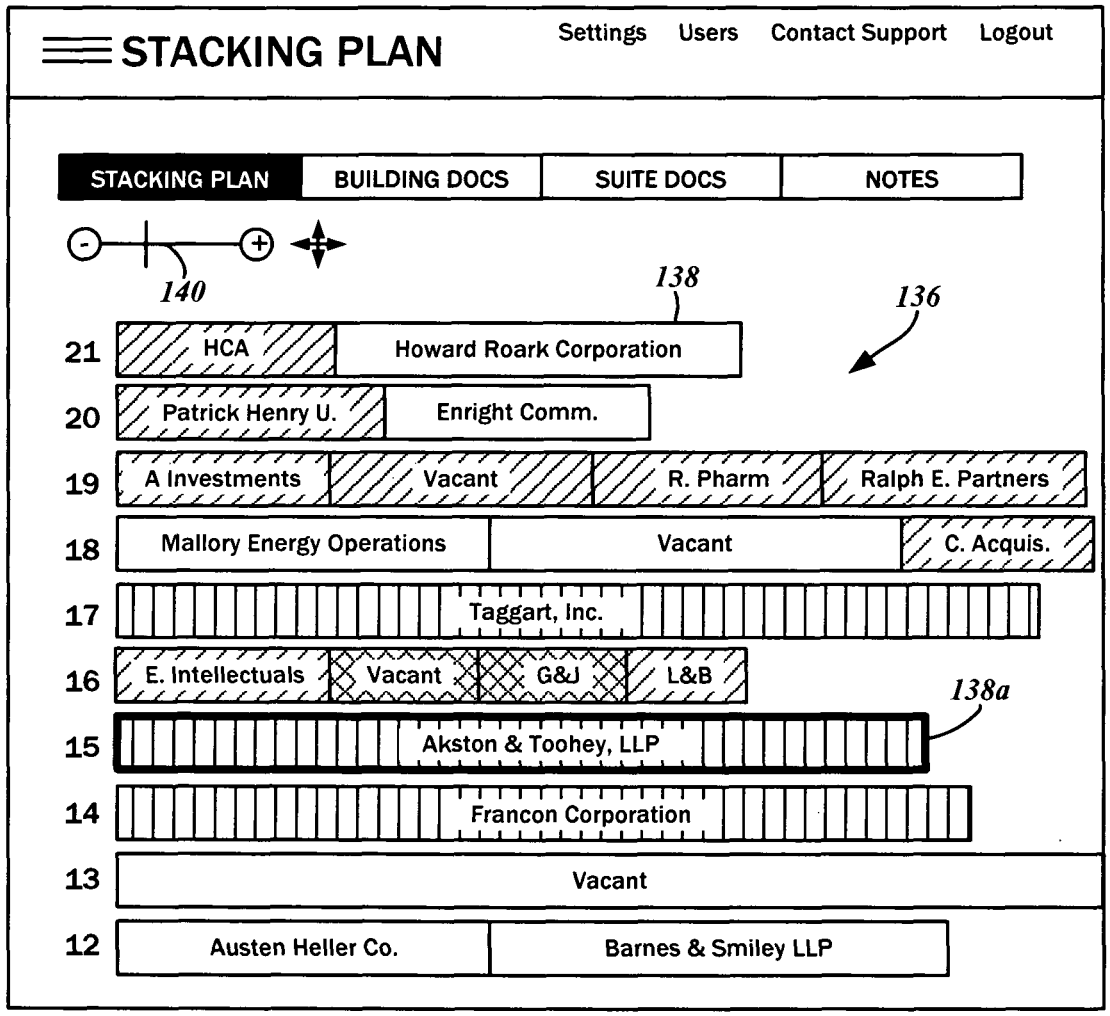
FIG. 10 is a screen capture of a stacking plan page.

FIG. 10 depicts an exemplary embodiment of a stacking plan 136 when rendered on the client computer system 16 after being transmitted thereto from the stacking plan application system 12 in accordance with step 1500 of the method. As shown, the stacking plan 136 is arranged according to the floors of a building, with each box 138 representing the area within the building occupied by that tenant or owner. It is possible to zoom in and zoom out of the view shown with zoom controls 140, as well as pan to different parts of the stacking plan 136 by clicking and dragging (when using the mouse) or by tapping and sliding (when using touch input). The view can be adjusted anywhere along the stacking plan 136 viewport, and is similar to the interactivity of online mapping systems. The stacking plan 136 visualizes occupant information, building common spaces, leasing information, and other useful data.

Figure 11:
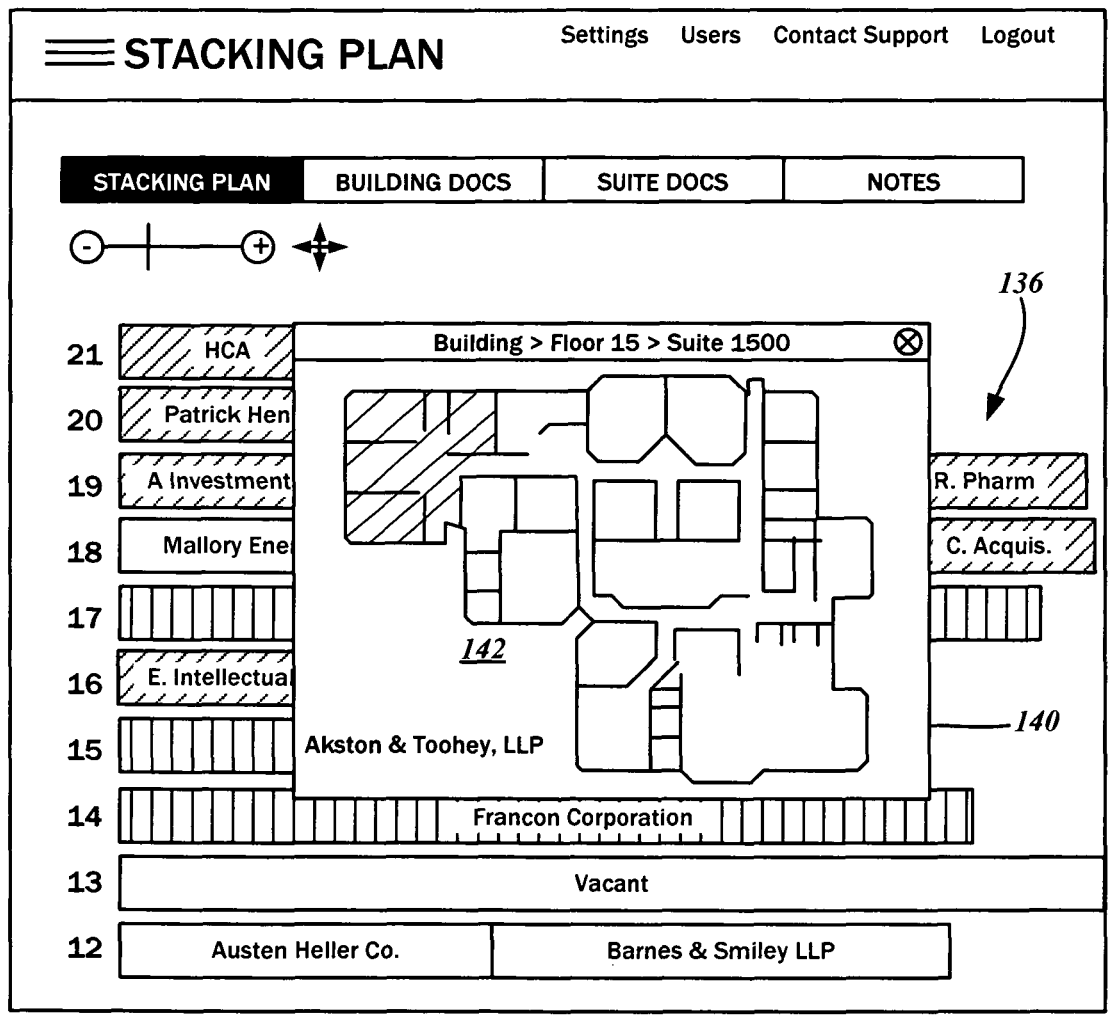
FIG. 11 is a screen capture of a stacking plan page with a tenant or ownership card showing additional details overlaid thereon.

Each of the boxes 138 in the stacking plan 136 is hyperlinked, and when activated, generates an independent display of at least one of the master tenant or occupant record attributes 104. This allows a broad view of the stacking plan 136 with minimal information, but when the user 18 needs to see and/or edit information at further levels of detail, it is simply a click away. More particularly, upon a first one of the boxes 138*a* being selected as shown in FIG. 10, a window overlay 140 is generated on top of the stacking plan 136 as shown in FIG. 11. The window overlay 140 may also be referred to as a card of the leased or owned space. As indicated above, any information regarding the leased or occupant space as stored or linked to from the master tenant or occupant record 102 may be displayed in accordance with various embodiments of the present disclosure. In the particular illustrated example, this is the tenant or occupant name ("Akston & Toohey, LLP") as well as the suite or unit number (1500).

Additionally, it is possible for external data such as the floor plan 142 to be displayed within the window overlay 140. In the illustrated example, the window overlay 140 is rendered on top of the floor plan 140. It is also possible for the window overlay 140 to be generated in its own window, if desired. This floor plan can be annotated by the user 18, and construction drawings as well as marketing drawings can be printed in response to the invoking such functionality directly from the window overlay 140. Along these lines, any annotations and the drawings can also be transmitted or otherwise communicated to other users 18 by invoking the same via controls on the window overlay 140/card. These annotations are entered into the client computer system 16 by the user, and transmitted to the stacking plan application system 12 for storage thereon. According to one embodiment, the drawings and related annotations are not stored by file name, but by stack location, i.e., building, floor, and suite or occupant. However, any suitable storage indexing/retrieval modality may be readily substituted without departing from the scope of the present disclosure.

Figure 12A:
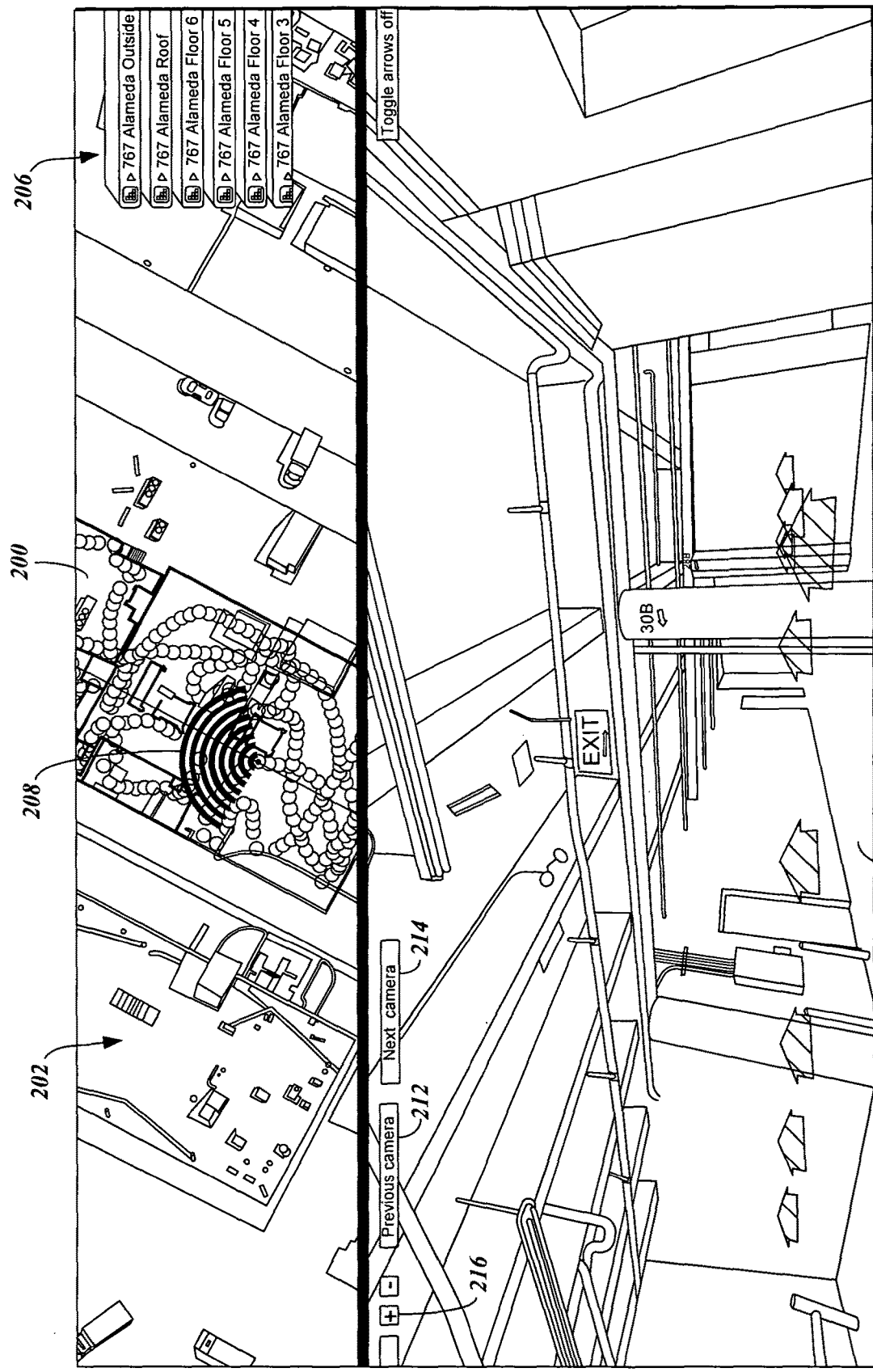
FIG. 12A-12C are screen captures of an example interface for presenting indoor photographic mapping image sequences.
Figure 12B:
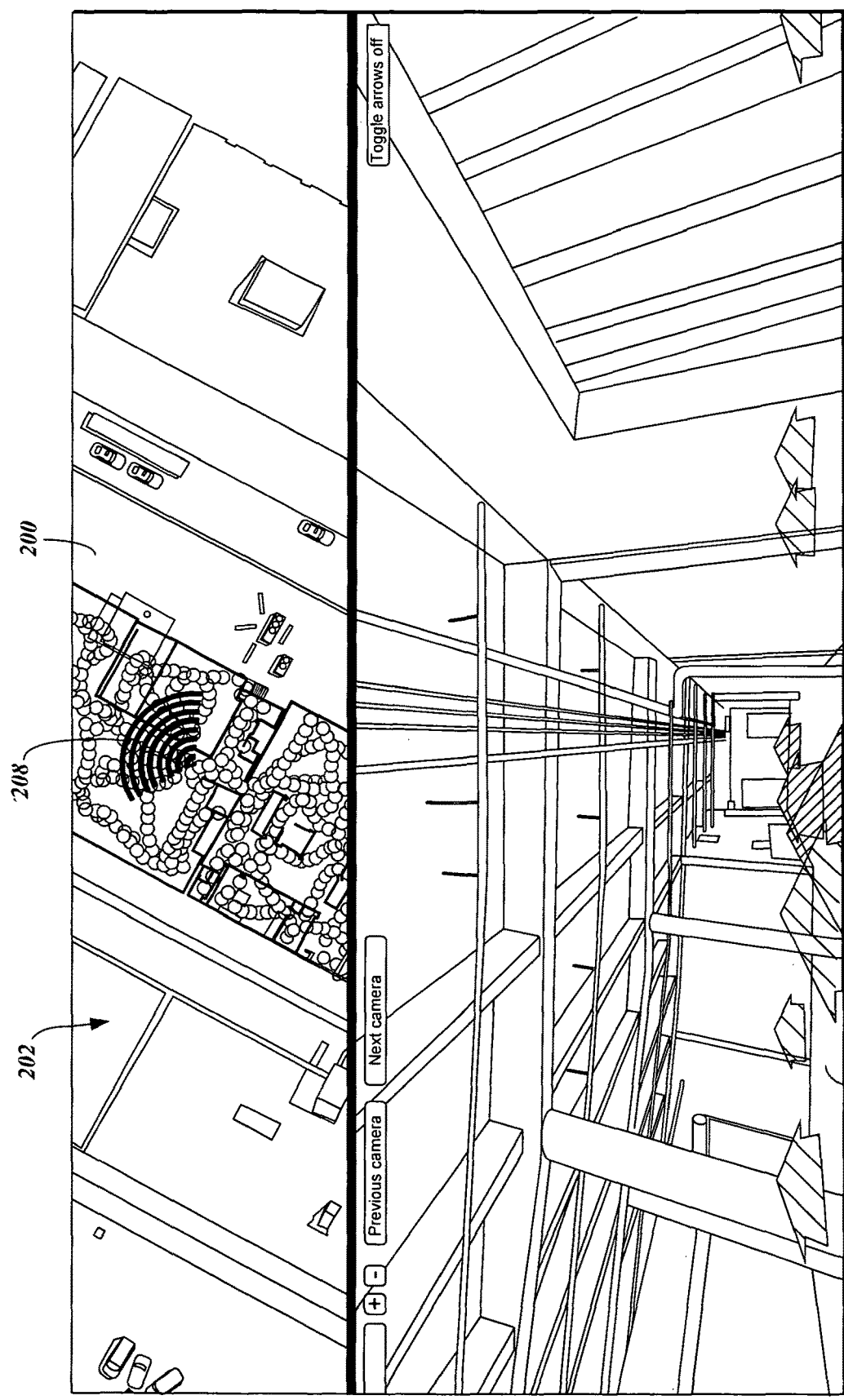
Figure 12C:
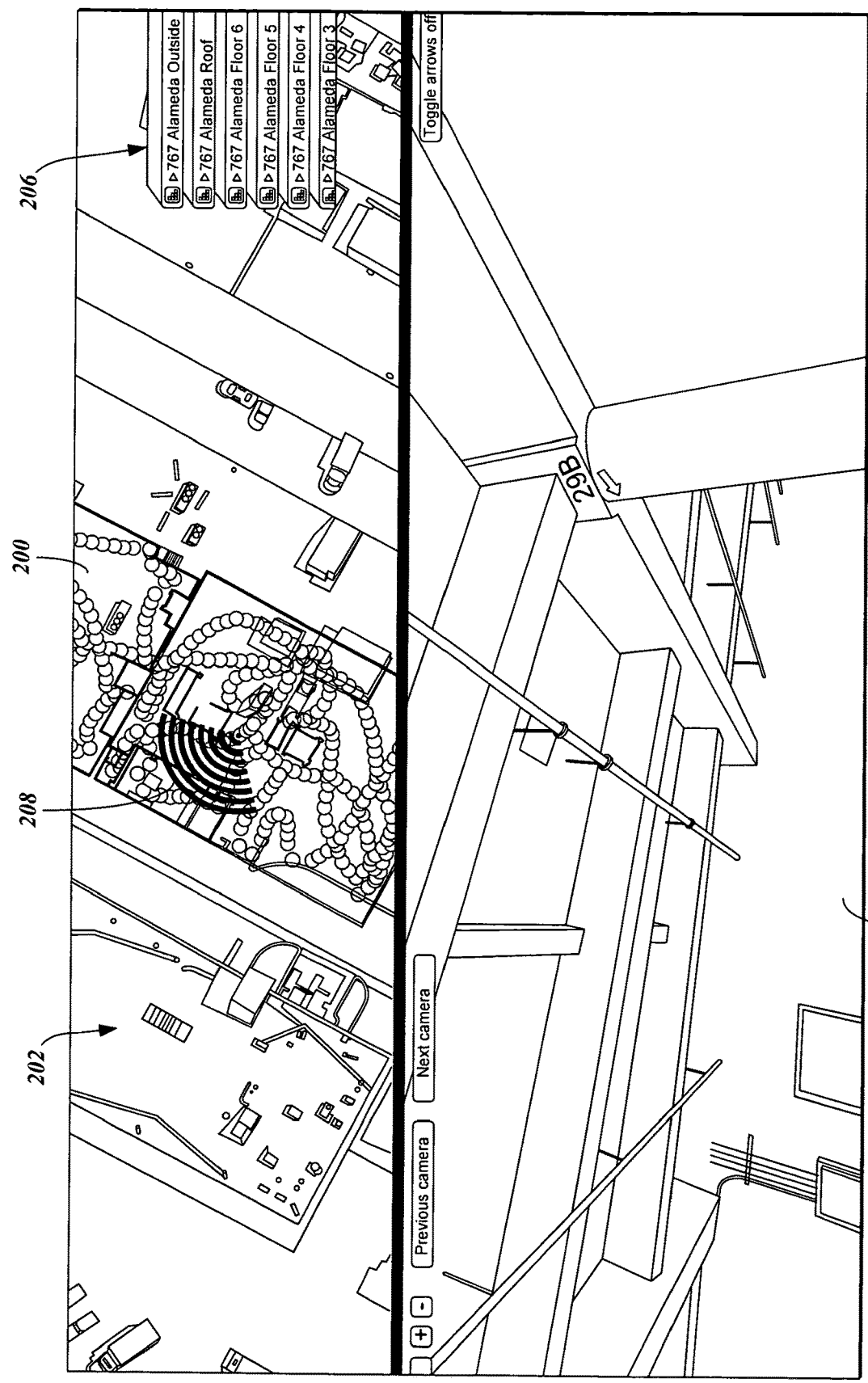

As noted above, another possible external data that may be presented is sequence of photographic walkthrough images that are spatially linked to various locations on the floor plan. FIGS. 12A-12C illustrate one possible interface 200 that may be used to so present such imagery. In further detail, there may be a map section 202 that includes a top plan view of the building. A photographed image from the geographic location corresponding to the building may be utilized, which is understood to be readily available from various mapping services. Adjacent to and below the map section 202 is an interior view section 204, which displays the various photographic images of the interior of a particular floor. The floor to be displayed is selected via a floor listing 206 that is overlaid on the interior view section 206. Activating any of the floor listings 206 will transition the displayed set of photographs to those corresponding to the selected floor. The angle of view of the image displayed in the interior view section 204 corresponds to that shown in the map section 202 by a view indicator 206. Along these lines, the sequence of photographic walkthrough images is understood to include various views taken at different locations throughout the floor, with each individual image being represented as markers 210 displayed on the map section 202. Similar markers 211 are also overlaid within the interior view section 204. Different images can be cycled through via the interior view section by activating the previous camera button 212 and the next camera button 214. In one preferred embodiment, the images are captured via a 360 degree view camera, so any given image may be panned as desired by conventional interactions with the interior view section 204. It is understood that additional details of a particular image may be discerned by utilizing zoom buttons 216. The foregoing interface for the sequence of photographic images of the floor is presented by way of example only, and other implementations are also possible.

Figure 13:
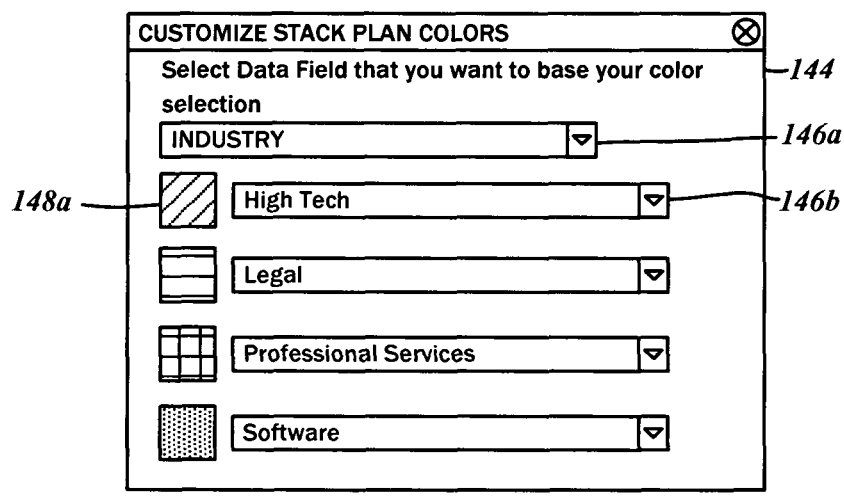
FIG. 13 is a screen capture of a first embodiment of a stacking plan customization interface.

The appearance of the boxes 138 in the stacking plan 136 is understood to be customizable, that is, the color, spacing, format, fields, and the additional information contained therein, may be changed depending on certain criteria and user preferences. FIG. 13 shows a first exemplary embodiment of a stacking plan customization interface 144*a* by which the visual appearance of the boxes 138 may be modified. Via a first pull down list 146*a*, the data field/master tenant record attribute 104 by which to color-code the boxes 138 is selected. In the example shown, it is the industry in which the tenant or occupant operates. A second pull down list 146*a* indicates which industry should have the color or pattern indicated by a first swatch 148*a* (High Tech). Based on the adjustments made, the color or pattern of the boxes 138 in the stacking plan 136 is adjusted in response. Furthermore, the visual appearance of corresponding cards or window overlays 140 may also be adjusted concurrently. Other pattern or color coding based upon, for example, remaining lease duration, may also be possible. The first pull-down list 146*a* is understood to include all of the master tenant or occupant record attributes 104, so any one can be selected as a basis for coding.

Figure 14:
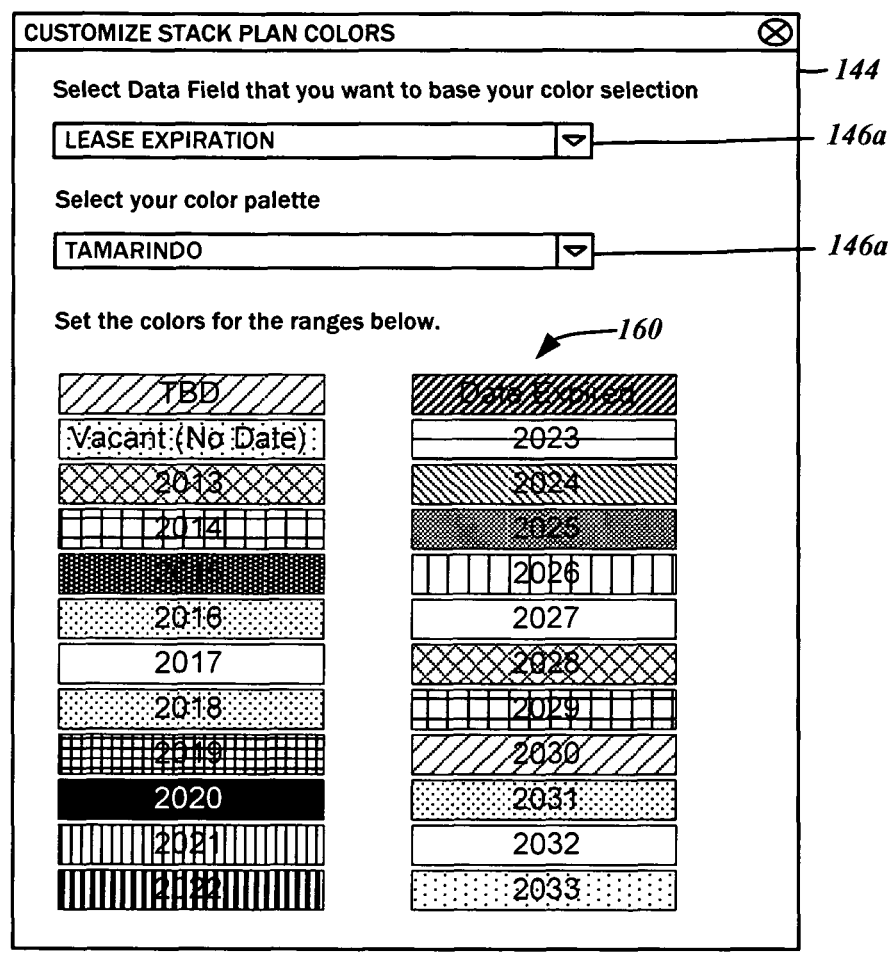
FIG. 14 is a screen capture of a second embodiment of a stacking plan customization interface.

In further detail illustrated in FIG. 14, a second exemplary embodiment of a stacking plan customization interface 144*b* again includes the first pull down list 146*a* that is used to select the data field/master tenant or occupant record attribute 194 by which the appearance of the boxes 138 in the stacking plan 136 are modified. As shown, the first pull down list 146*a* specifies the lease expiration year. Rather than another pull-down list, there are individual swatch boxes 160 for each possible lease expiration year, along with one for an indeterminate expiration year, no expiration year, and past expired leases. Although a separate swatch box 160 between 2013 and 2035 is provided, this is by way of example only and not of limitation. Additional or fewer years of expiration may be shown. By activating any one of the swatch boxes 160, different colors and/or patterns may be specified. For the sake of convenience, a consistent palette of colors and/or patterns for each of the swatch boxes 160, rather than individual adjustments thereto, may be designated in sets via a third pull down list 146*c*.

As indicated above, the foregoing customization to the appearance of the boxes 138 may be applied and visualized in a refreshed stacking plan 136. With reference to the screen captures of FIG. 15A and FIG. 15B, in order to aid in the understanding of the variously colored and/or patterned boxes 138, a legend 162 may be provided. In accordance with various embodiments, the legend 162 may be displayed to the side of the stacking plan 136 within a common interface area. However, it is also possible for the legend 162 to be overlaid on the stacking plan 136 after invoking such functionality by activating a button or the like.

Figure 15B:
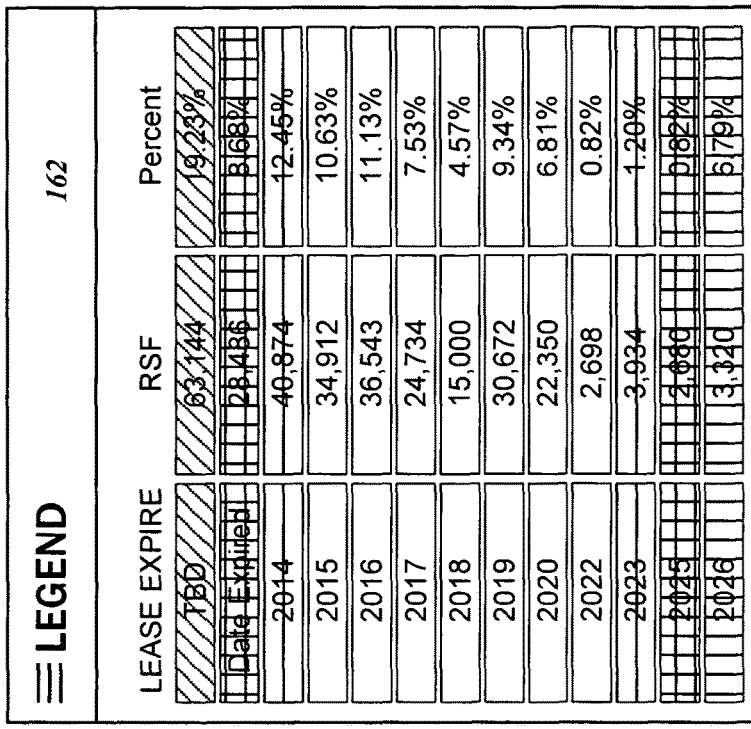
FIG. 15A-15B are example legends for customized visualizations of the stacking plan.
Figure 15A:
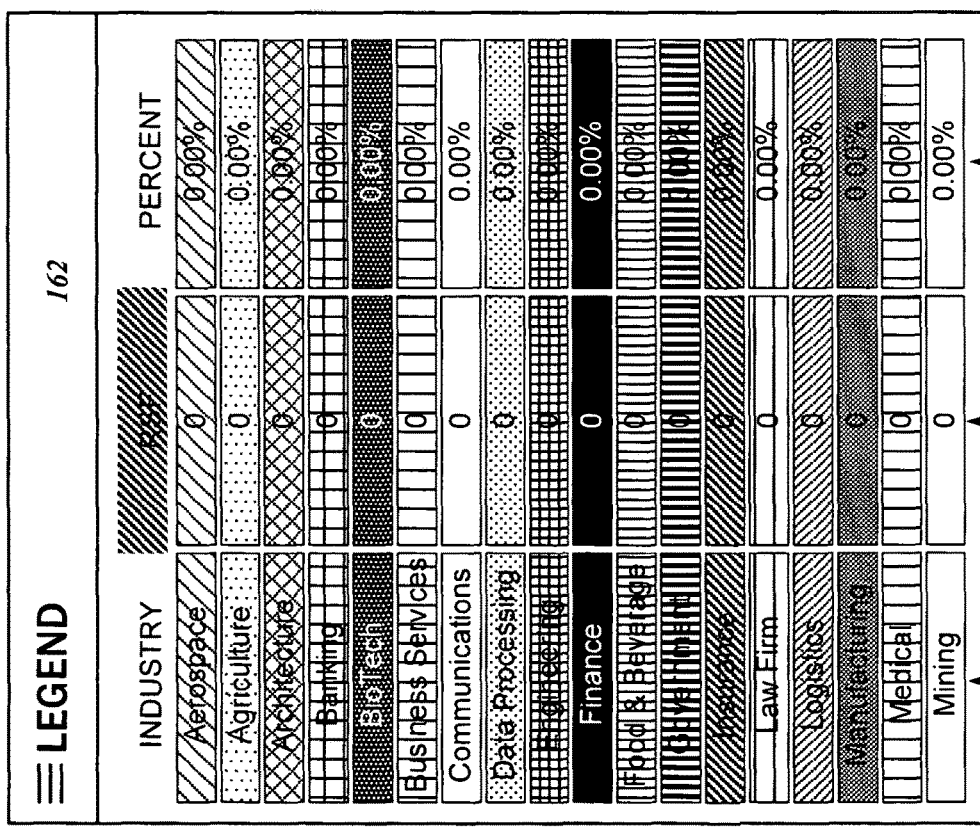

As best shown in FIG. 15A, when the particular industry in which the tenants operate is selected as the basis for the color/pattern coding, a first column 164*a* lists each of the possible values thereof. The displayed values may be based upon a pre-programmed static list, or may be based upon the industries represented by the various tenants or occupant in the building. A second column 164*b* lists the rented square footage or square meter for the corresponding industry shown in the same row on the first column 164*a*, and a third column 164*c* lists the relative percentage of the rented or owned square footage in comparison to other industries. In this regard, the various representative industries of all of the tenants or occupant in a given building may be readily visualized. Each of the elements for a given row in each of the first, second and third columns 164a-164c are color or pattern coded in accordance with the aforementioned customizations.

The legend 162 may be similarly implemented when the selected color/pattern coding basis is the year in which the various tenants' leases expire, as shown in FIG. 15B. A first column 166a lists each of the possible values for the lease expiration dates, while a second column 166b lists the corresponding rented square footage or square meter of all of the tenants or occupant with a lease expiration or purchase date on a given year. Furthermore, a third column 166c lists the percentage of the rented or owned square footage or square meter with leases expiring or available to purchase in a given year. Again, each of the elements for a given row in each of the first, second and third columns 166a-166c are color or pattern coded in accordance with the defined customizations. As will be appreciated by those having ordinary skill in the art, the legend 162 shown in this way may assist with visualizing the spread of lease expiration or to be purchased in years for the entirety of the building to aid with management and marketing efforts, among numerous other uses.

Figure 16A:
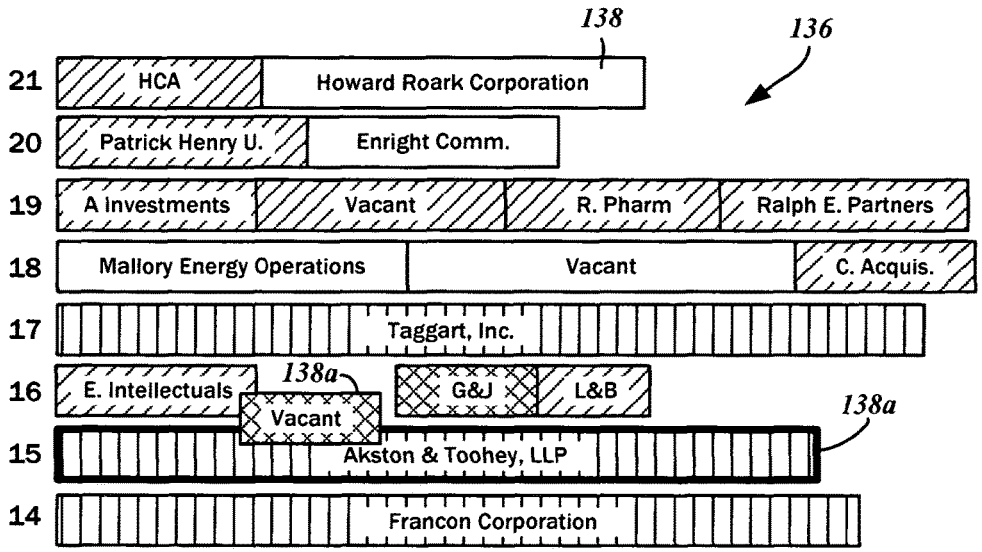
FIG. 16A-16C are screen captures of various interactivity contemplated for the stacking plan.
Figure 16B:
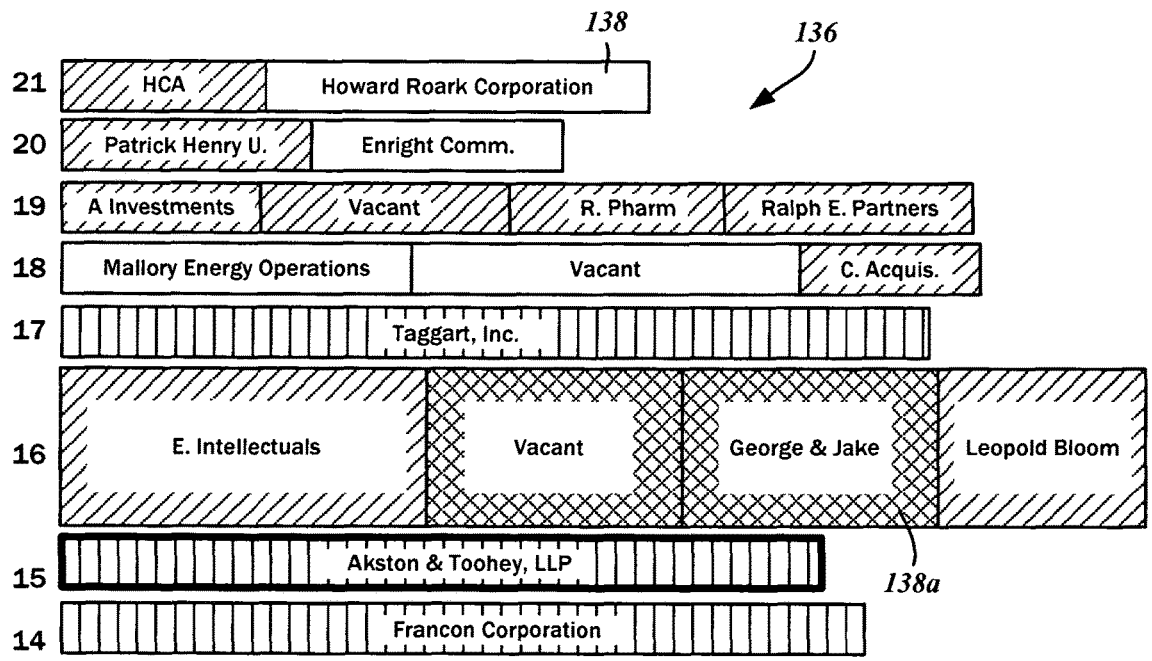
Figure 16C:
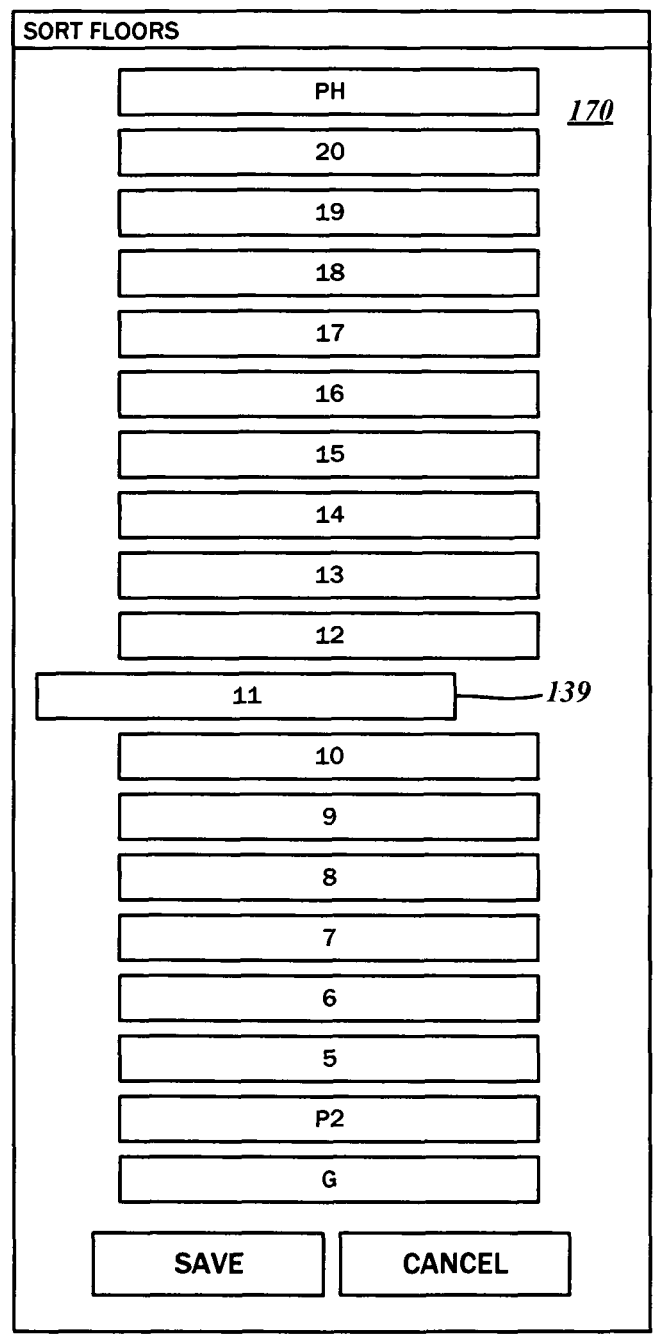

With reference to the screen captures of FIGS. 16A-16C, further interactivity with the individual boxes 138 of the stacking plan 136 are also contemplated. As discussed above, each of the boxes 138 are understood to correspond to a specific area within the building occupied by a tenant or occupant. As particularly shown in FIG. 16A, the first one of the boxes 138a is being moved around within the stacking plan 136 by clicking and dragging the same (when using the mouse) or by tapping and sliding (when using touch input). The box 138a may be moved to a different position relative to the other boxes 138 on the same floor, or to different positions on a different floor. The underlying master tenant or occupant record 102 of the moved box 138 is not affected when the relative position within the same floor is modified, though when it is moved to a different floor, the corresponding floor identifier attribute 104 may be revised.

Referring now to FIG. 16B, and as indicated above, it is also possible to alter the size of the boxes 138 so that the data displayed therein is viewable. Depending on the length of the text strings for the tenant or occupant identifier attribute 104b, the lease or occupant space identifier attribute 104c, and other data that are shown in a given box 138, some characters may be truncated in a default view that proportions the sizes according to the actual leased space. The depicted box 138a has its width and height adjusted. It is expressly contemplated that when the height of a particular box 138 is adjusted, so are the heights of the other boxes 138 within the same row. However, in accordance with one embodiment, when the width of a particular box 138 is adjusted, the widths of the other boxes within the same row remain the same. The overall length of the entire floor, that is, the position of the other boxes 138 following the adjusted box 138a (e.g., to the left) may be moved. It is also possible for the widths of the other boxes to be adjusted to retain the graphical proportionality relative to the adjusted box 138a, with the overall length of the entire floor being correspondingly extended. It is envisioned that the underlying data of the master tenant or occupant record 102 is not modified when the size of the boxes 138 are so adjusted, though other embodiments contemplate such a feature.

Similar to the aforementioned manipulation of the individual boxes 138, entire floors can also be moved about as depicted in FIG. 16C. A separate floor sorting window interface 170 is provided, graphically depicting each of the floors in a building as boxes 139. According to various embodiments of the present disclosure, the boxes 139 may be moved around in the same manner as discussed above in relation to the boxes 138 in the stacking plan 136. Moving one floor (box 139) to another is understood to modify the underlying data in the master tenant record 102 for each of the tenants or occupant in that floor, along with those of other or occupant tenants on different floors that are affected by the re-ordering.

Figure 17A:
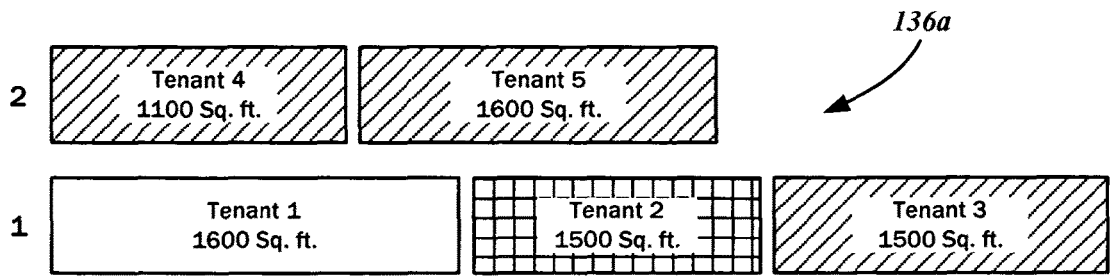
FIG. 17A-17C are example visualizations of a user supplied data set for a stacking plan, a certified data set for the stacking plan, and a comparison of the user supplied and certified data sets for the stacking plan.
Figure 17B:
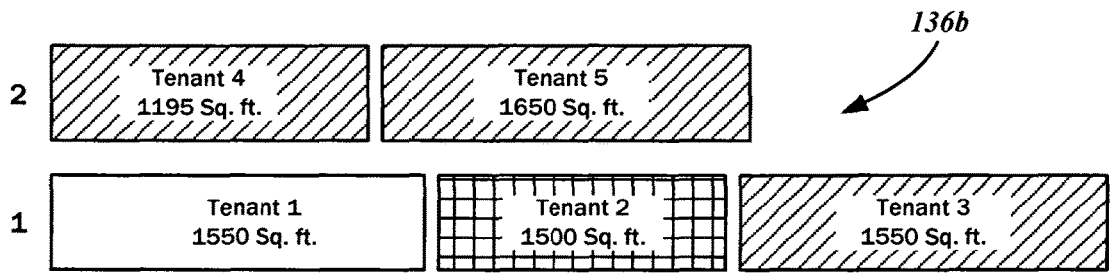
Figure 17C:
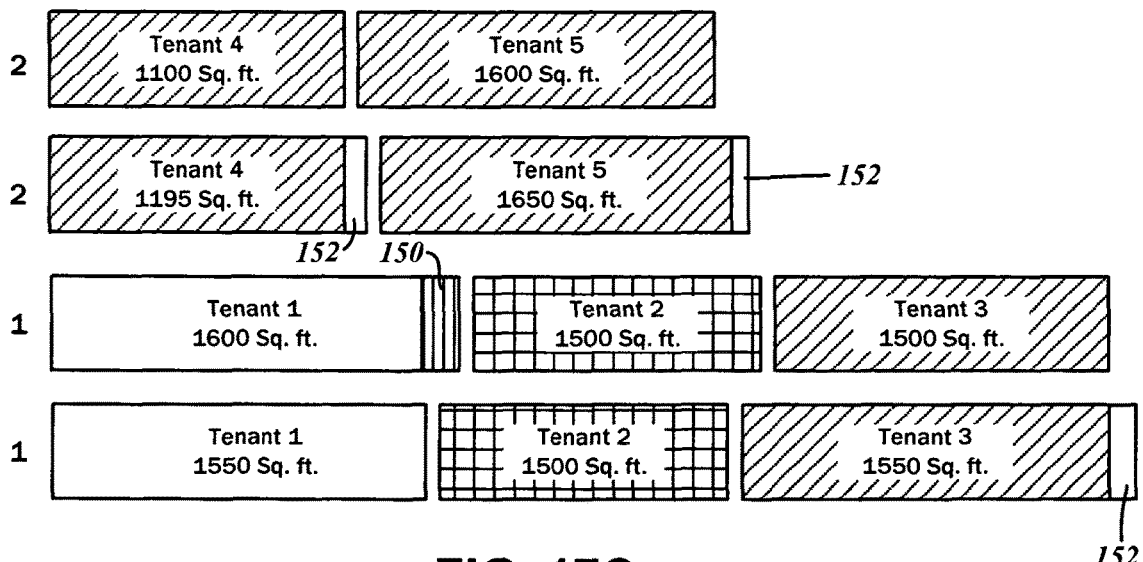

In the embodiments where the data stored in the master tenant or occupant records 102 are cross-checked with certified data, a modality by which any differences can be visualized in the stacking plan 136 is contemplated. FIG. 17A shows a first stacking plan 136a that was generated from data provided by the user 18, and FIG. 17B shows a second stacking plan 136b that was generated from certified data. A comparison was made between the values represented by these stacking plans 136 in accordance with step 1215 discussed above. FIG. 17C is a shows a comparison between the first stacking plan 136a and the second stacking plan 136b. In any case there is a discrepancy between the first stacking plan 136a and the second stacking plan 136b, the particular box 138 is segregated into a first section and a second section. In one implementation, the stacking plan 136 with the higher square footage or square meter is so divided into the first section and the second section, and when the user-provided data has a higher number, the second segment of the box 138 highlighting the difference is given a first color code 150, and when the certified data has a higher number, the second segment of the box 138 highlighting the difference is given a second color code 152.

Figure 18A:
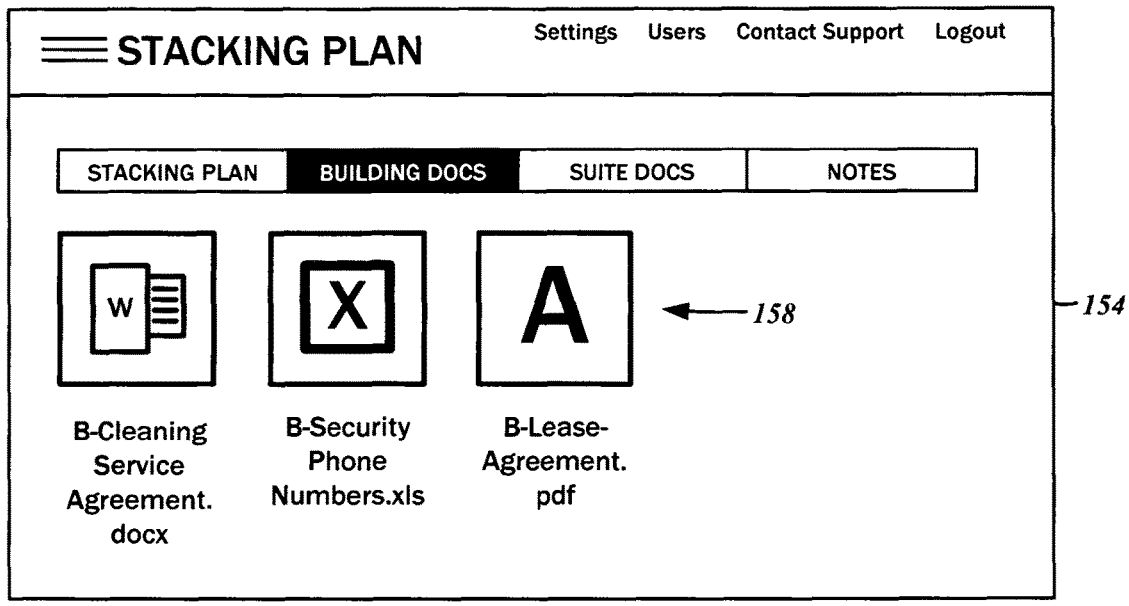
FIG. 18A-18B are screen captures of document access pages.
Figure 18B:
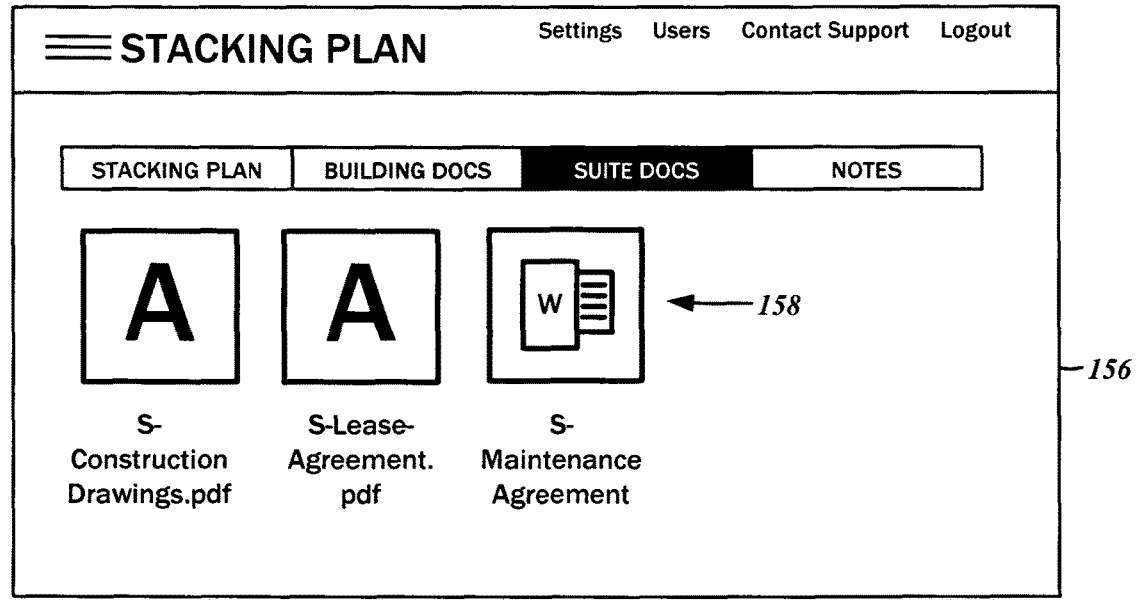

As indicated above, various documents 130d can be saved to the master tenant or occupant records 102 as well as to the building records 132. Once saved, one of the ways they may be retrieved is via a building document access page 154 shown in FIG. 18A, and a suite document access page 156 shown in FIG. 18B. Both document access pages 154, 156 display a series of icons 158 representative of downloadable files. The documents listed in the building document access page 154, however, pertain to the building generally, rather than to a specific tenant. In this regard, access to such documents may be limited in accordance with the permission settings discussed above. The documents listed in the suite or unit document access page 156 are, as its name suggests, specific to the suite, unit, owner and tenant. In both cases, double clicking the icons 158 is understood to be operative to begin downloading the corresponding file.

The particulars shown herein are by way of example and for purposes of illustrative discussion of the embodiments of the present disclosure only and are presented in the cause of providing what is believed to be the most useful and readily understood description of the principles and conceptual aspects of the interactive building stacking plans. In this regard, no attempt is made to show more details than is necessary for a fundamental understanding of the disclosure, the description taken with the drawings making apparent to those skilled in the art how the several forms of the presently disclosed methods may be embodied in practice.

What is claimed is:

1. A method for presenting on a client computer system an interactive stacking plan of a building with one or more floors of leasable space, the method comprising the steps of:
    transmitting a request for stacking plan graphical elements from the client computer system to the server computer system, each of the stacking plan graphical elements corresponding to a leased space represented by a master tenant record defined by a plurality of tenant record attributes including at least a floor identifier attribute, a tenant identifier attribute, and a leased space identifier attribute, the master tenant record being stored in a master building database in communication with the server computer system;

receiving the stacking plan graphical elements on the client computer system;

generating on the client computer system an output of the stacking plan graphical elements for each of the master tenant records with a size initially proportional to a leased space specified in the leased space identifier attribute and a user-activatable link that generates an independent display of at least one of the master tenant record attributes, the stacking plan graphical elements being arranged according to the floor identifier attributes of the corresponding master tenant records with each row associated with a particular value of the floor identifier attributes;

receiving an input corresponding to a direct visual movement of a first one of the stacking plan graphical elements from a first row to a second row that is responsively reflected in the generated output of the stacking plan graphical elements as the input is received and the floor identifier attribute in the master tenant record for the first one of the stacking plan graphical elements being updated to reflect the direct visual movement from the first row to the second row, each of the stacking plan graphical elements being directly modifiable to a horizontal size independent of the leased space identifier attribute thereof;

visually removing the first one of the stacking plan graphical elements from the first row; and visually adding the first one of the stacking plan graphical elements to the second row.

2. The method of claim 1, further comprising:
adjusting horizontal sizes of other stacking plan graphical elements in the second row in response to the received movement of the first one of the stacking plan graphical elements.

3. The method of claim 1, wherein the leased space identifier attribute defines a usable square footage of a particular space in the building leased or owned by a tenant specified by the tenant identifier attribute.

4. The method of claim 1, further comprising:
transmitting to the client computer system external data stored in the master building database in association with a specified one of the master tenant records.

5. The method of claim 4, wherein the external data is selected from a group consisting of a multimedia file, an image file, a sequence of photographic three-dimensional walkthrough images, a document file, metadata, and a user-generated note.

6. The method of claim 4, wherein the external data is included in the independent display generated in response to a user input activating the user-activatable link.

7. The method of claim 1, wherein a visual appearance of the stacking plan graphical elements are user-defined.

8. The method of claim 1, wherein a visual appearance of the stacking plan graphical elements are based upon a remaining lease duration.

9. The method of claim 1, wherein a visual appearance of the stacking plan graphical elements are based upon a tenant industry designation.

10. The method of claim 1, wherein a visual appearance of the stacking plan graphical elements are based upon purchased data.

* * * * *